(12) United States Patent
Rohrbaugh et al.

(10) Patent No.: US 7,516,379 B2
(45) Date of Patent: *Apr. 7, 2009

(54) CIRCUIT AND METHOD FOR COMPARING CIRCUIT PERFORMANCE BETWEEN FUNCTIONAL AND AC SCAN TESTING IN AN INTEGRATED CIRCUIT (IC)

(75) Inventors: John G. Rohrbaugh, Fort Collins, CO (US); Jeffrey R. Rearick, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 290 days.

This patent is subject to a terminal disclaimer.

(21) Appl. No.: 10/818,866

(22) Filed: Apr. 6, 2004

(65) Prior Publication Data

US 2005/0229056 A1    Oct. 13, 2005

(51) Int. Cl.
G01R 31/28 (2006.01)
G06F 11/00 (2006.01)
G01R 23/175 (2006.01)

(52) U.S. Cl. .................... 714/731; 714/700; 714/798; 324/76.54

(58) Field of Classification Search ......... 714/700–789, 714/798; 324/76.54
See application file for complete search history.

(56) References Cited

U.S. PATENT DOCUMENTS

| | | | |
|---|---|---|---|
| 5,254,942 A | 10/1993 | D'Souza et al. | |
| 5,428,626 A | 6/1995 | Frisch et al. | |
| 5,703,489 A * | 12/1997 | Kuroe | 324/601 |
| 5,933,039 A * | 8/1999 | Hui et al. | 327/262 |
| 5,935,256 A * | 8/1999 | Lesmeister | 713/400 |
| 5,978,942 A * | 11/1999 | Rockoff | 714/724 |
| 6,256,760 B1 * | 7/2001 | Carron et al. | 714/726 |
| 6,320,436 B1 * | 11/2001 | Fawcett et al. | 327/158 |
| 6,442,722 B1 * | 8/2002 | Nadeau-Dostie et al. | 714/731 |
| 6,484,294 B1 | 11/2002 | Kiyoshige et al. | |
| 6,763,485 B2 * | 7/2004 | Whetsel | 714/726 |
| 6,907,556 B2 * | 6/2005 | Siegel | 714/726 |
| 6,934,921 B1 * | 8/2005 | Gu et al. | 716/6 |
| 6,948,096 B2 * | 9/2005 | Parvathala et al. | 714/30 |
| 6,995,554 B2 | 2/2006 | Loke et al. | |
| 7,079,973 B2 | 7/2006 | Rodgers et al. | |
| 7,123,001 B2 | 10/2006 | Loke et al. | |
| 2002/0105337 A1 * | 8/2002 | Coates et al. | 324/519 |
| 2002/0157050 A1 * | 10/2002 | Whetsel | 714/726 |

(Continued)

FOREIGN PATENT DOCUMENTS

EP    1584940    10/2005

OTHER PUBLICATIONS

Wikipedia.com, Static Timing Analysis, Wikipedia, Feb. 28, 2007, 1.*

(Continued)

*Primary Examiner*—Cynthia Britt

(57) ABSTRACT

A circuit and method for determining operating speed of a clock associated with an integrated circuit (IC), includes an IC logic element, a scan chain, and a calibration circuit including a first plurality of flip-flops and a combinational delay line. The calibration circuit operates in a functional test mode and in a scan test mode to determine a clock signal delay between the functional test mode and the scan test mode.

16 Claims, 16 Drawing Sheets

U.S. PATENT DOCUMENTS

2003/0188243 A1    10/2003  Rajan
2004/0193981 A1*    9/2004  Clark et al. .................. 714/726
2005/0222795 A1*   10/2005  Rodgers et al. ............. 702/117
2005/0229056 A1*   10/2005  Rohrbaugh et al. ......... 714/726

OTHER PUBLICATIONS

IBM Technical Disclosure Bulletin, NN8006328 Zero Delay Set Reset Latch with Edge-Triggered Strobe Control. Jun. 1980 vol. 23 Issue 1 pp. 328-329.*

* cited by examiner

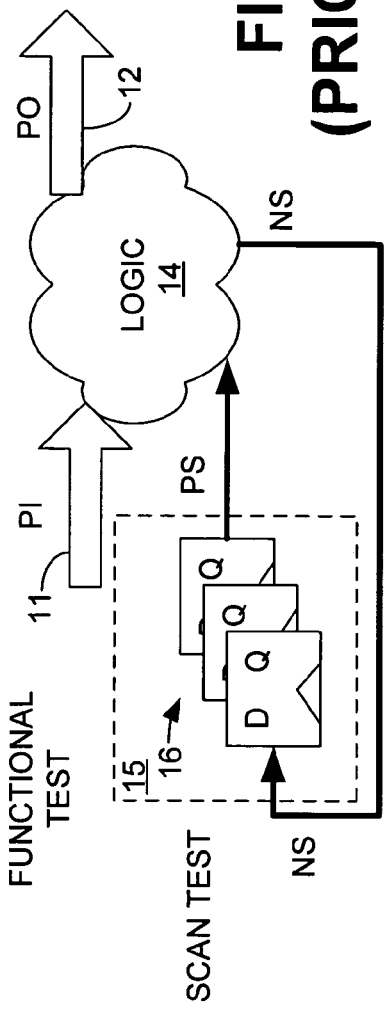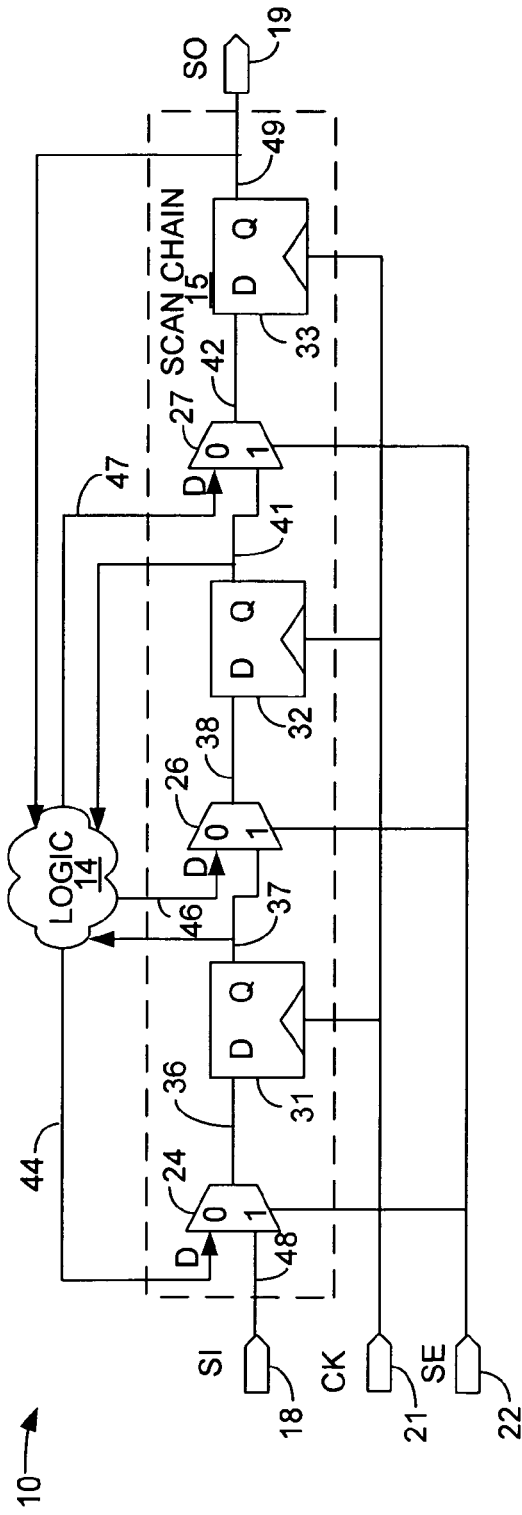
FIG. 1A (PRIOR ART)
FIG. 1B (PRIOR ART)

FUNCTIONAL SPEED DETERMINATION STATE DIAGRAM

CIRCUIT AND METHOD FOR COMPARING CIRCUIT PERFORMANCE BETWEEN FUNCTIONAL AND AC SCAN TESTING IN AN INTEGRATED CIRCUIT (IC)

BACKGROUND

Integrated circuits (ICs) and, more specifically, application specific integrated circuits (ASICs) are becoming more and more complex, and are operating at ever increasing clock speeds. Accordingly, testing the functionality of integrated circuits is becoming an ever increasing challenge for IC test designers and engineers. Generally, testing an integrated circuit falls into two broad categories, functional testing and structural testing. Functional testing involves stimulating the primary inputs of the integrated circuit and measuring the results at the primary outputs of the integrated circuit. Functional testing exercises the functionality of logic elements within the integrated circuit and is a traditional method to ensure that the integrated circuit can perform its intended operations. However, developing and implementing a high-quality functional test for a complex integrated circuit is very labor intensive, and the application of such a functional test requires costly equipment.

Therefore, to reduce the effort and expense required to test an integrated circuit, structural testing has emerged as an alternative to functional testing. In a structural test, the internal storage elements of the IC are used to control and observe the internal logic. This is generally done by linking the storage elements into a serial shift register when a test mode signal is applied. This technique is referred to as "scan testing". Scan testing is divided into two broad categories, static scan testing (also referred to as DC scan testing) and dynamic scan testing (also referred to as AC scan testing or scan-based delay testing). Generally, scan testing involves providing a scan chain comprising a number of interconnected multiplexers and registers connected to the combinational logic of the integrated circuit. The registers in the scan chain are typically implemented using D flip-flops. The scan chain can be many hundreds of thousands of flip-flops in length, and is generally divided into a smaller number of shorter parallel scan chains, each comprising approximately one hundred to one thousand flip-flops and multiplexers. The actual number depends on the complexity of the logic to be tested.

During DC scan testing, scan data may be clocked into the scan chain at a clock rate significantly slower than the anticipated operating clock rate of the integrated circuit. After the scan data is loaded into the scan chain registers, a primary input state is applied to the combinational logic of the integrated circuit. The combination of the scanned-in present state and the applied primary inputs comprises the test stimulus. The values of the primary outputs are then measured and a single clock cycle (sometimes referred to as a "clock pulse") is executed to capture the response of the circuit to the stimulus. To complete the DC scan test, the values captured in the flip-flops are scanned out of the scan chain. As these values are scanned out of the scan chain they are compared to the expected data by test equipment to verify the correctness of the combinational logic within the IC. Unfortunately, DC scan testing allows timing-related faults to remain undetected due to the static nature of the test.

Dynamic (AC) scan testing is similar to DC scan testing with the main difference being the execution of two successive clock pulses at the operating frequency of the integrated circuit being tested during the capture period. By executing two successive clock pulses, the first of which launches transitions and the second of which captures the response of the circuit to these transitions, the timing performance of the circuit can be evaluated.

FIG. 1A is a block diagram illustrating a simplified prior art integrated circuit 10. The integrated circuit 10 includes logic 14 and a scan chain 15 formed through the flip-flops 16. The logic 14 comprises the logic elements that determine the operational parameters of the IC 10. Primary inputs 11 are input to the logic 14 while the primary outputs 12 are obtained based on the response of the logic 14 to the present state of the flip-flops 16 and the values of the primary inputs 11. The integrated circuit 10 also includes a scan chain 15 formed by a plurality of flip-flops 16 preceded by a corresponding plurality of multiplexers (not shown in FIG. 1A), in which the present state output (Q) of a flip-flop is input to both the logic 14 and the next flip-flop in the scan chain 15.

FIG. 1B is a block diagram illustrating in further detail the integrated circuit 10 of FIG. 1A. The integrated circuit 10 includes a plurality of D flip-flops, each preceded by a corresponding multiplexer to facilitate the connection of the scan chain. This type of scan implementation is referred to as "mux-d scan" and is intended to be illustrative and not limiting. In this example, a pad 18, which is referred to as a "scan-in" (SI) pad, supplies scan input data via connection 48 to a first multiplexer 24. The first multiplexer 24 is responsive to a scan enable signal from pad 22. The scan enable (SE) signal 22 is applied to multiplexers 24, 26 and 27. A clock (CK) signal from pad 21 is applied to flip-flops 31, 32, and 33. When the scan enable signal is high (a logic 1) the scan-in input on connection 48 is selected by multiplexer 24 and applied to the D input to the flip-flop 31. Conversely, when the scan enable signal is low (a logic 0), the next state of the flip-flop 31 is provided by the logic 14 via connection 44. The normal operation input to each of the multiplexers 24, 26, and 27 comes from the combinational logic 14 and is selected when the scan enable (SE) signal 22 is low (a logic 0). The output of the flip-flop 33 is supplied via connection 49 to a scan output pad 19. Further, the Q outputs of each flip-flop 31, 32 and 33, are supplied via connections 37, 41 and 49, respectively, as the present state to the logic 14.

Activating the scan enable signal on pad 22 forms a scan chain 15 from flip-flops 31, 32, and 33 by configuring them into a shift register. When scanning in data, successive clock pulses applied via the clock input pad 21 load each of the flip-flops 31, 32 and 33 with a known state. As each new pattern is shifted into the scan chain 15, the old pattern shifts out and is observed, thus testing the response of the IC.

To describe the operation of the scan chain 15 shown in FIG. 1B used in AC scan mode, in a first step, the scan enable signal is set to logic high and data is scanned into each of the flip-flops in the scan chain 15 on a series of successive clock cycles. The clock cycles used to scan in the data to the scan chain may be at a frequency significantly slower than the normal operating frequency of the IC 10. The primary inputs are then loaded and the primary outputs are analyzed. The scan enable signal is then lowered, and, after a brief pause, two successive clock pulses at the normal operating frequency of the integrated circuit 10 are applied to the circuit. This type of AC scan test is referred to as a "broadside" or "system clock launch" test. Other AC scan test protocols such as "last shift launch" or "skewed load" may alternatively be used during this launch/capture portion of the test. A "last shift launched" or "skewed load" scan test uses a last shift of a scan chain to launch a transition, and then applies a single clock pulse to capture the data. After the launch and capture events are complete, the scan enable signal is raised and the data is scanned out of the scan chain 15 via the pad 19 and the scan out data is analyzed. This will be described in greater detail below with respect to FIG. 1C.

FIG. 1C is a timing diagram 50 illustrating the operation of the prior art integrated circuit 10 of FIG. 1B during AC scan testing. The timing diagram 50 is divided into a scan-in period 61, a launch/capture period 62 and a scan-out period 64. The timing diagram 50 also includes a clock (CK) trace 52, a scan enable (SE) trace 54, and primary input (PI) trace 56, a primary output (PO) trace 57, a scan in (SI) trace 58, and a scan out (SO) trace 59. As shown, the clock trace 52 illustrates a series of successive clock cycles that are generated during a scan in period 61, whereby the clock pulses 52 are generated at a frequency (rate) that is significantly slower than the normal operating frequency of the integrated circuit 10 being tested. During the scan in period 61, the scan enable trace 54 indicates that the scan enable signal is at a constant logic high. During the scan-in period 61, the primary inputs generally remain constant, while the primary outputs may transition between logic low and logic high at a frequency determined by the frequency of the clock input 52. Significantly, during the scan-in period 61, the scan-in trace 58 indicates that data is being scanned-in to the registers (flip-flops) within the scan chain 15 at the rate of the clock 52. Though the scan out pad 19 (FIG. 1B) will be active during the scan-in period 61, the scan-out trace 59 indicates that no measured data transitions occur at the scan-out pad 19 during the scan-in period 61 (i.e. the scan out data on pad 19 is ignored during the scan-in period in this example).

During the launch/capture period 62, the scan enable signal 54 transitions from a logic high to a logic low. The primary input trace 56 is then transitioned, thereby loading a desired value into the logic 14, which can occur before, during, or after the transition of the scan enable signal 54. In response, the primary output trace 57 transitions immediately after the primary input trace, giving rise to a period 66 during which the primary outputs can be measured for the timeliness of the response. This portion of the test identifies if there are any delay defects on paths between primary inputs and primary outputs. Though usually affecting only a small portion of most ICs, these delay defects are important because they affect what are often critical speed paths within the IC. A critical speed path in the IC represents the longest propagation time for a data signal traversing the logic contained within the clock domain defined by a particular clock distribution network in the IC.

At a later time within the launch/capture period 62, a pair of clock pulses 65 are provided at the normal operating frequency of the integrated circuit 10 that is being tested. The first clock pulse 67 can be referred to as the "launch" clock pulse and the second clock pulse 68 can be referred to as the "capture" clock pulse. The two successive clock pulses at the normal operating frequency of the integrated circuit allow functional testing of the logic 14 connected between the flip-flops 15 of the integrated circuit. The logic 14 generally represents a majority of the circuitry on the IC 10. A plurality of such patterns comprising scan-in, launch/capture, and scan-out periods is generally required to fully test an IC. Unfortunately, as will be described below with respect to FIG. 2, the two successive clock pulses 65 occurring at the operating frequency of the integrated circuit 10 may be subject to a delay sufficient to cause an erroneous test result to appear. Briefly, the delay is attributed to the voltage drop that occurs on the IC power supply as the launch clock pulse 67 causes switching activity in the logic 14, with the result that the current available to drive the following capture clock pulse 68 is significantly less than what is desired. This voltage drop and resulting current starvation may delay the rise of the capture clock pulse 68 to a point such that the actual test frequency is less than the operating frequency of the integrated circuit 10, thus rendering the AC scan test inaccurate and unreliable.

The scan-out period 64 indicates that the scan enable signal 54 is again at a logic high, thus enabling the scan data to be scanned out of the scan chain 15 via pad 19 at a rate equal to the clock rate 52, which, during the scan out-period 64, is at a rate slower than the normal operating frequency of the IC 10 and similar to the scan-in clock rate.

FIG. 2 is a graphical illustration depicting the effect of voltage drop on the successive clock pulses described in FIG. 1C. The graphical illustration 70 includes an input reference clock (REF_CLK) trace 71, a clock output (CLK_312_OUT) trace 72 and a power supply voltage monitor (VDD_MONITOR) trace 74. The pair of clock pulses 76 shown in clock trace 71 are similar to the launch clock pulse 67 and the capture clock pulse 68 of FIG. 1C. For illustration purposes only, the desired reference clock frequency of the clock pulses 76 is 312.5 megahertz (MHz), which equates to a clock cycle time of 3.2 nanoseconds (ns) for each clock pulse. The clock output trace 72 is responsive to the reference clock input trace 71 and is shown using trace 78. Trace 78 represents the response of the on-chip clock distribution network to the input reference clock pulses, and thus includes a first pulse 79 and a second pulse 80, both of which reflect the insertion delay relative to the reference clock pulses that caused them. The first pulse 79 results from the first pulse 75 of the reference clock 71 and the second pulse 80 results from the second reference clock pulse 77. However, the second clock pulse 80 has an additional delay beyond that due to insertion delay. As shown, the original reference clock period of 3.2 ns has elongated to 3.7 ns after the pulses propagate through the clock distribution network on the integrated circuit 10 (FIG. 1A).

The power supply voltage monitor trace 74 includes a curve 81, which illustrates the clock period elongation described above. The curve 81 begins at a voltage level of 1.8 volts (V) and, upon the initiation of the clock pulse 79, indicates that the voltage begins to drop from 1.8 V down to approximately 1.54 V during the second clock pulse 80. The degradation of the supply voltage (i.e., the voltage drop) from about 1.8 V to about 1.54 V renders the IC incapable of providing adequate current to drive the second rising clock edge in a timely fashion and thus gives rise to the clock period elongation, whereby the clock period beginning at the rising edge of pulse 79 to the rising edge of pulse 80 has been elongated to 3.7 ns. Remember that the input clock frequency of 312.5 MHz corresponds to a clock period of 3.2 ns. The 3.7 ns clock period of the output clock 72 corresponds to approximately 270 MHz clock frequency. Therefore, the voltage drop, as shown by the voltage trace 81, turns a 312.5 MHz input clock into a 270 MHz output clock. This causes the testing of the integrated circuit device 10 to occur at a frequency significantly below the desired frequency.

Therefore, it will be desirable to have a way to measure the amount of clock period elongation caused by voltage drop during testing of an integrated circuit.

SUMMARY

In one embodiment, a circuit and method for determining operating speed of a clock associated with an integrated circuit (IC), comprises an IC logic element, a scan chain, and a calibration circuit comprising a first plurality of flip-flops and a combinational delay line. The calibration circuit operates in a functional test mode and in a scan test mode to determine a clock signal delay between the functional test mode and the scan test mode.

Other methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The circuit and method for comparing circuit performance between functional and AC scan testing in an integrated circuit can be better understood with reference to the following figures. The components within the figures are not necessarily to scale, emphasis instead being placed upon clearly illustrating the principles of the system and method. Moreover, in the figures, like reference numerals designate corresponding parts throughout the different views.

FIG. 1A is a block diagram illustrating a simplified prior art integrated circuit.

FIG. 1B is a block diagram illustrating in further detail the integrated circuit 10 of FIG. 1A.

DETAILED DESCRIPTION

The calibration circuit to be described in detail below can be implemented and integrated onto any existing integrated circuit. Further, multiple iterations of the calibration circuit can be implemented on an integrated circuit, depending on the number of clock domains that are sought to be calibrated on the integrated circuit or on the number of places within each clock domain calibration is desired. While the calibration circuit will be described below using specific hardware elements, modules and devices, the calibration circuit can be implemented using a variety of different technology.

Figure 3A:
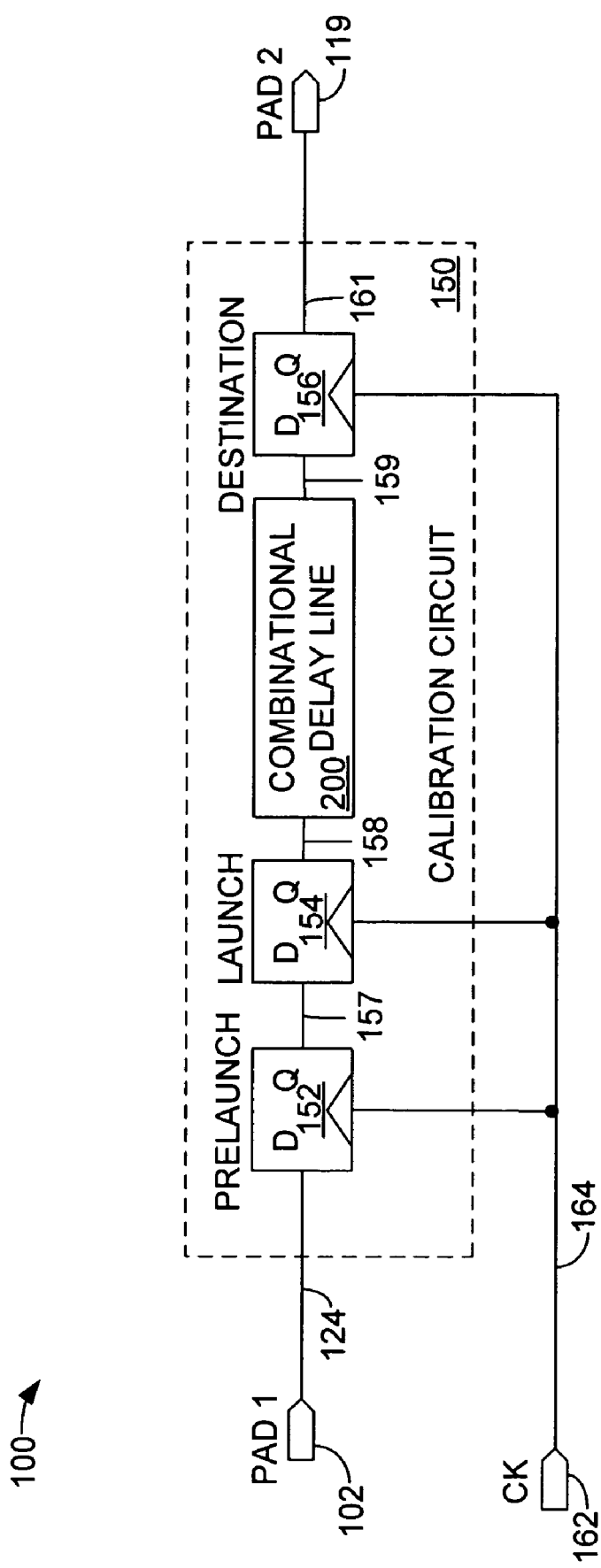
FIG. 3A is a block diagram illustrating an embodiment of the calibration circuit for comparing circuit performance between functional and AC scan testing.

FIG. 3A is a block diagram illustrating an embodiment of the calibration circuit 150 for comparing circuit performance between functional and AC scan testing. The example circuit 100 includes calibration circuit 150, pad 102 which serves as an input pad to the calibration circuit 150, and pad 119 which serves as an output pad for the calibration circuit 150. The clock, the period of which is being calibrated, is supplied via the CK pad 162.

The output of the pad 102 is supplied via connection 124 as an input to the calibration circuit 150. The calibration circuit 150, the operation of which will be described in further detail below, includes three D-flip-flops 152, 154, 156 and a combinational delay line 200. However, other types of registers may be used. The flip-flop 152 is referred to as a "pre-launch" flip-flop, the flip-flop 154 is referred to as a "launch" flip-flop, and the flip-flop 156 is referred to as a "destination" flip-flop. A clock (CK) input signal is provided on pad 162 and is supplied via connection 164 to each of the flip-flops 152, 154 and 156.

The combinational delay line 200 receives the output of the launch flip-flop 154 via connection 158. The combinational delay line can be programmed to variably delay the propagation of the signal through the calibration circuit 150 and will be described in greater detail below. The output of the combinational delay line 200 is provided to the destination flip-flop 156 via connection 159.

Figure 1C:
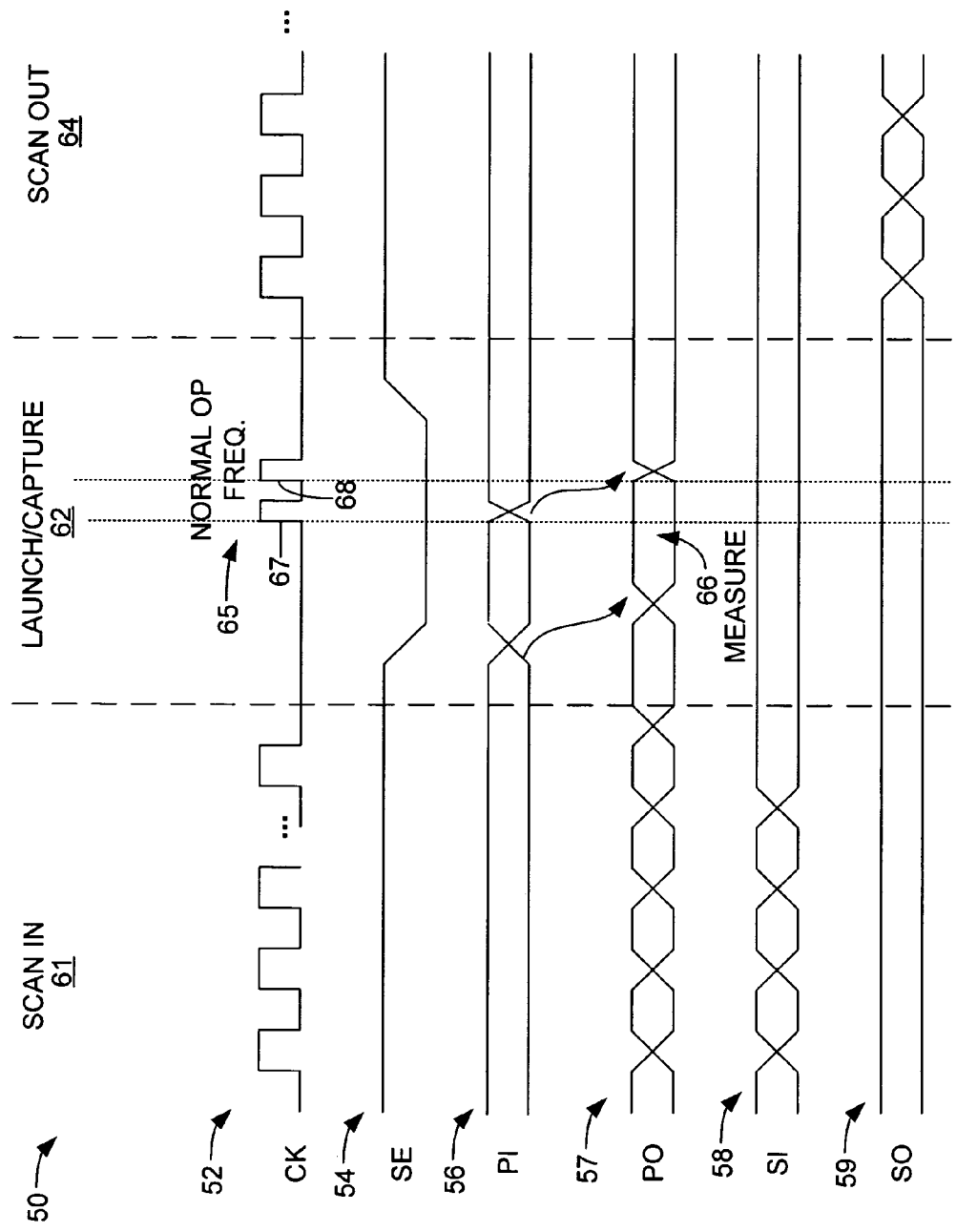
FIG. 1C is a timing diagram illustrating the operation of the prior art integrated circuit 10 of FIG. 1B during AC scan testing.
Figure 2:
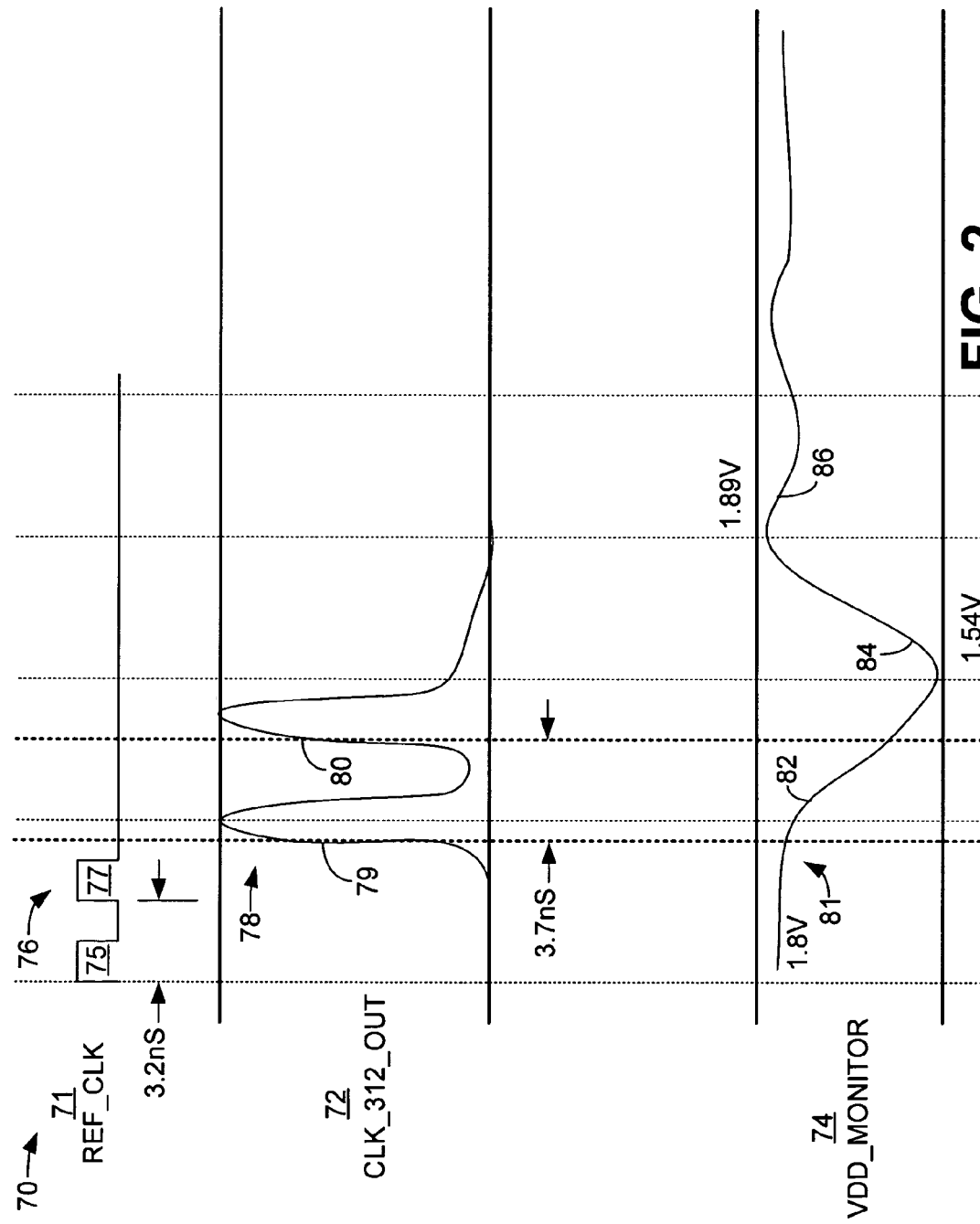
FIG. 2 is a graphical illustration depicting the effect of voltage drop on the successive clock pulses described in FIG. 1C.
Figure 3B:
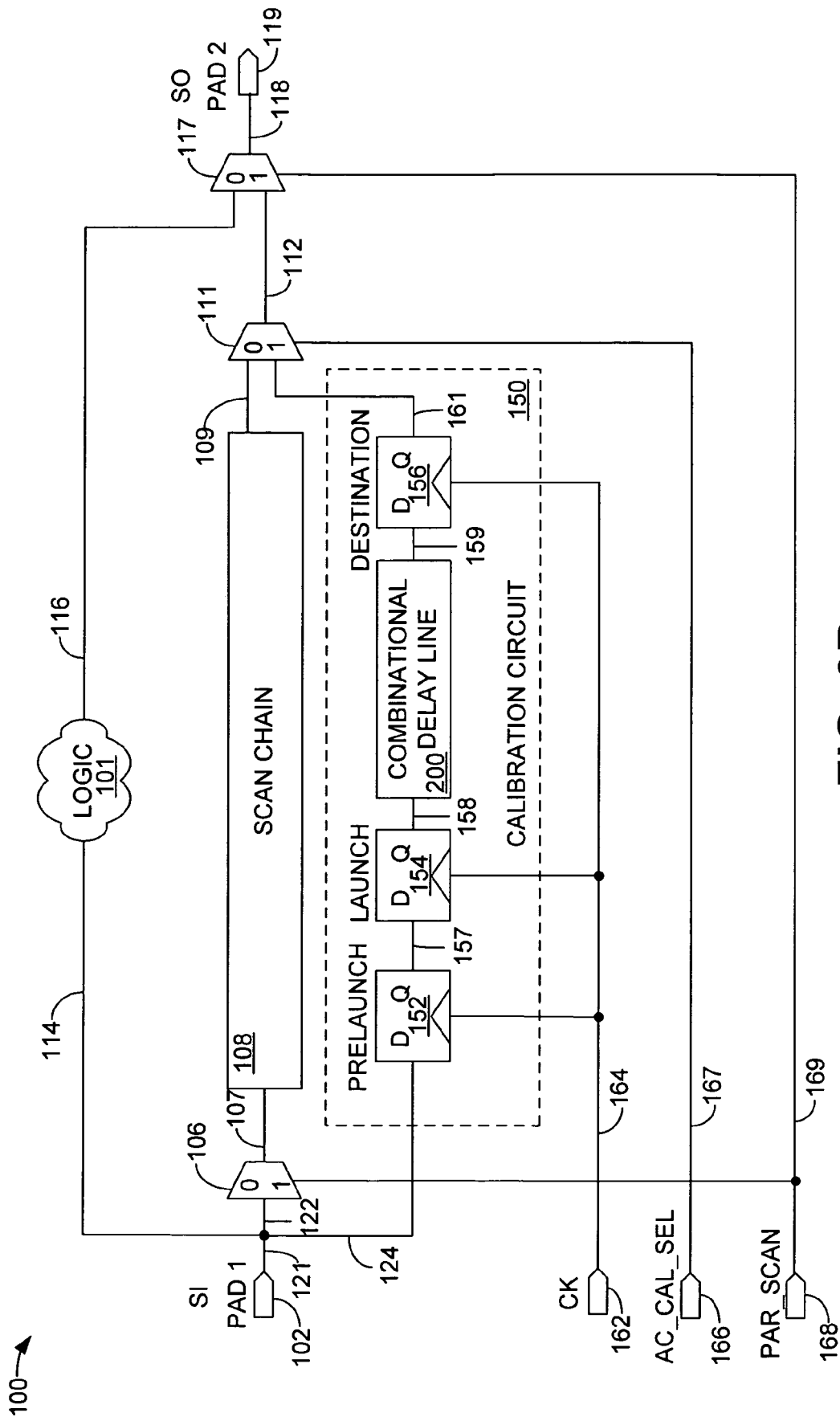
FIG. 3B is a block diagram illustrating an embodiment of an integrated circuit including the calibration circuit of FIG. 3A for comparing circuit performance between functional and AC scan testing.

FIG. 3B is a block diagram illustrating one embodiment of an integrated circuit including the calibration circuit 150 for comparing circuit performance between functional and AC scan testing. The IC 100 includes logic 101, a scan chain 108 (similar to the scan chain 15 of FIG. 1B), and a calibration circuit 150, all co-located on the same chip. The pad 102 serves as an input pad for the logic 101 during normal IC operation and serves as a scan input pad when operating in scan mode. The pad 102 also serves as an input pad to the calibration circuit 150. The pad 119 serves as an output pad during normal operation of the logic 100 and as a scan output pad when the IC 100 is operating in scan mode.

The output of the pad 102 on connection 121 is supplied via connection 122 to a multiplexer 106. The output of the multiplexer 106 is supplied via connection 107 to the scan chain 108. The output of the scan chain 108 is supplied via connection 109 to a first input of the multiplexer 111. The output of the multiplexer 111 on connection 112 is supplied to a second input of the multiplexer 117. A first input of the multiplexer 117 is supplied via connection 116 from the logic 101.

The output of the pad 102 is also supplied via connection 124 as an input to the calibration circuit 150, as previously described. An AC calibration select (AC_CAL_SEL) signal on pad 166 is supplied via connection 167 to control the multiplexer 111. A parallel scan (PAR_SCAN) signal on pad 168 is supplied via connection 169 to the multiplexer 106 and the multiplexer 117. When the parallel scan signal 168 is set to a logic high (logic 1), the multiplexer 106 receives scan input data via the pad 102 and provides the scan data via connection 107 to the scan chain 108. Similarly, if the parallel scan signal 168 is set to logic high, the multiplexer 117 provides either the output of the scan chain 108 or the output of the calibration circuit 150 to the pad 119. When the parallel scan signal 168 is at a logic low, the scan chain 108 is not connected between pads 102 and 119, as is the case when the IC 100 is under normal operation.

When the AC_CAL_SEL signal 166 and the PAR_SCAN signal 169 are set to logic high (logic 1), the output of the calibration circuit 150 is supplied to pad 119 through the multiplexer 111 and the multiplexer 117. The calibration circuit 150 is located "on chip" with the logic 101 and the scan chain 108, thus allowing an accurate measurement of circuit clock performance in both functional test mode and in scan test mode. Typically, although a single calibration circuit 150 is shown, a calibration circuit 150 is provided for each clock domain on the integrated circuit 100, and multiple calibration circuits may be used on a single clock domain.

Figure 3C:
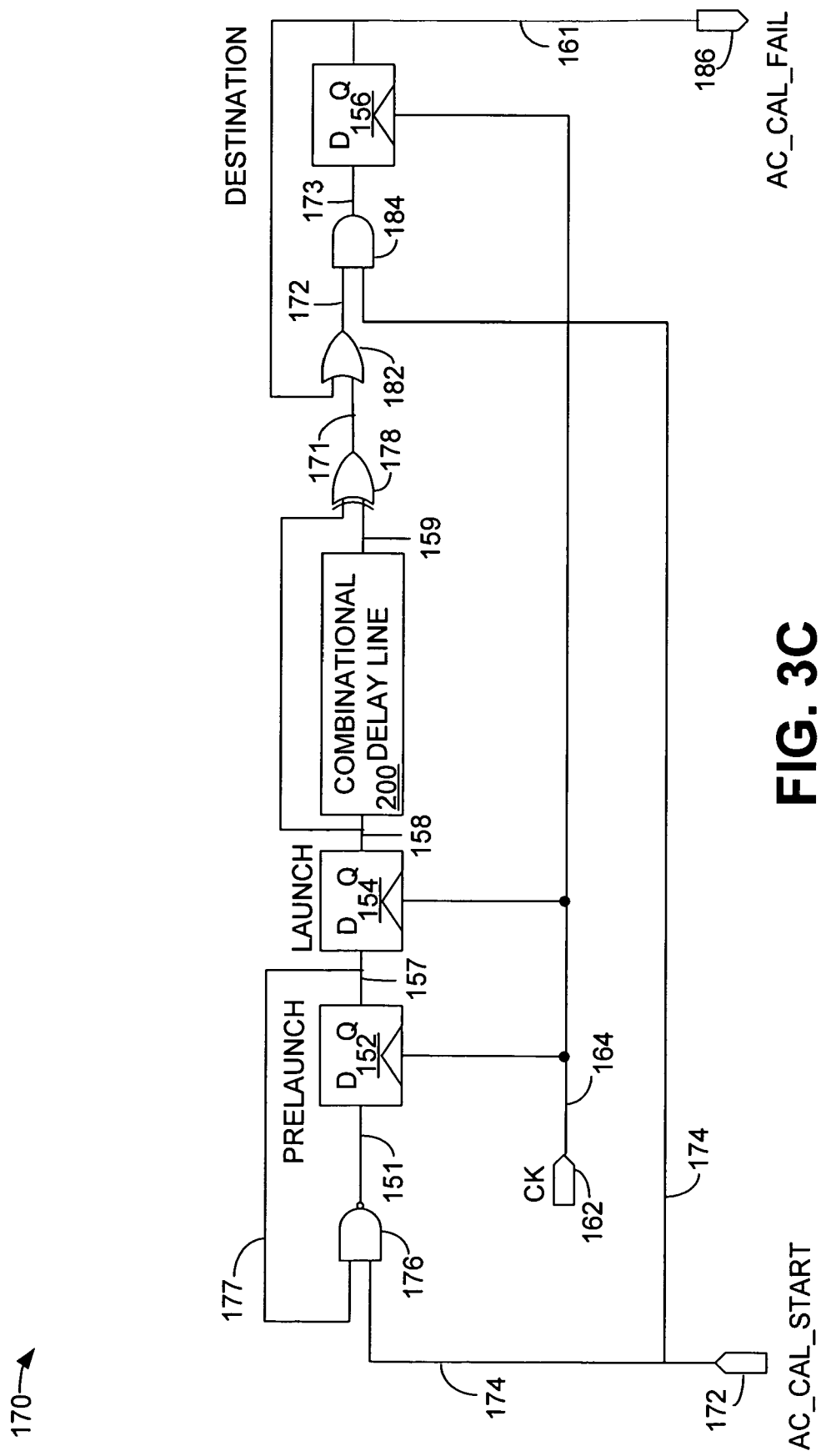
FIG. 3C is a block diagram illustrating an alternative embodiment of the calibration circuit for comparing circuit performance between functional and AC scan testing.

FIG. 3C is an alternative embodiment 170 of the calibration circuit 150 of FIG. 3A. The calibration circuit 170 includes additional logic to enable autonomous operation. The calibration circuit 170 eliminates the connections to external chip pins 102 and 119 (FIG. 3B). In this embodiment, an input test signal AC_CAL_START 172, when set low (logic 0), forces the destination flip-flop 156 to capture a logic 0, which is reported on the output test signal AC_CAL_FAIL 186 via connection 161. When the AC_CAL_START signal 172 is set to logic 0, the pre-launch flip flop 152 (and one clock cycle later the launch flip-flop 154) captures a logic 1. When the AC_CAL_START signal 172 is set to logic 1, the output of the pre-launch flip-flop 152 (and one clock cycle later launch flip-flop 154) will toggle every clock cycle due to the NAND gate 176, producing a sequence of pulses via connection 151, that are input through the flip-flops 152 and 154 as input 158 to the combinational delay line 200. A delayed version of these pulses appears at connection 159 and is compared to the undelayed version on connection 158 by an exclusive-OR (XOR) gate 178. If there is a difference in the values of the delayed and undelayed versions, the signal on connection 171 (and thus on connection 172 at the output of the OR gate 182) and at the output 173 of the AND gate 184 during AC_CAL_START, will be forced high (logic one). If this difference in values persists until the next rising edge of the clock signal CK 162, then the destination flip-flop 156 will capture the fact that the delay of the combinational delay line 200 was more than one cycle in duration. This condition will cause the output signal AC_CAL_FAIL 186 to rise to a logic 1, and will force all subsequent values of the destination flip-flop 156 to be logic 1 via the OR gate 182 until the AC_CAL_START signal 172 is lowered.

Figure 4A:
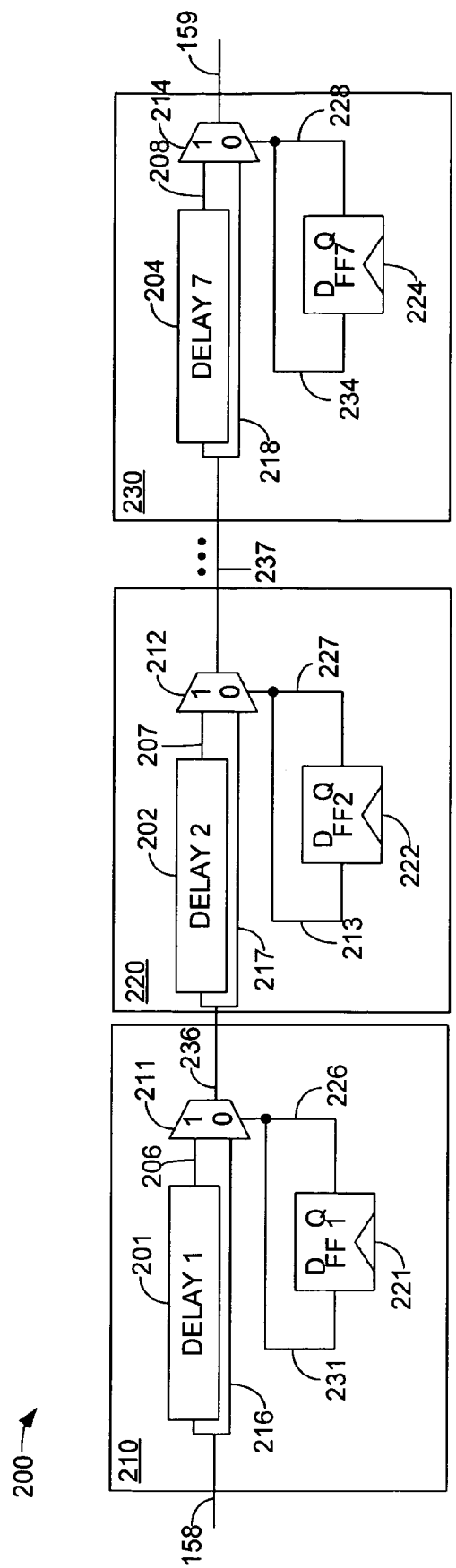
FIG. 4A is a block diagram illustrating an embodiment of the combinational delay line of FIG. 3.

FIG. 4A is a block diagram illustrating one embodiment of the combinational delay line 200 of FIGS. 3A, 3B and 3C. The combinational delay line 200 includes a plurality of delay segments, three of which are illustrated in FIG. 4A for simplicity. In the described embodiment, seven (7) delay segments are provided. The delay segment 210 receives an input from connection 158 which is the output of the launch flip-flop 154 (FIGS. 3A, 3B and 3C) and provides an output via connection 236 to a second delay segment 220. Delay segments 3-6 are omitted for simplicity. The output of the sixth delay segment (not shown) is provided on connection 237 as input to the seventh delay segment 230. Each delay segment includes a flip-flop, a delay element and a multiplexer responsive to the flip-flop. The first delay segment 210 includes delay element 201, multiplexer 211 and flip-flop 221. In this example, the flip-flop 221 is a D flip-flop similar to the flip-flops 152, 154, and 156 in FIGS. 3A, 3B and 3C.

The second delay segment 220 includes a delay element 202, a multiplexer 212, and a flip-flop 222, and the final delay segment 230 includes a delay element 204, a multiplexer 214 and flip-flop 224, configured as described with respect to delay segment 210. The delay elements 201, 202 and 204 in the respective delay segments 210, 220 and 230 are each different in length. By length is meant the amount of time it would take a signal to propagate through the delay element. The delay is typically measured using logic gate transition time. For example, the delay element 201 might be one gate in length (thus providing one "gate delay"), while the delay element 202 might be two gates in length (thus providing a delay of two gate delays), extending up to the delay element 204, which, in this example, is sixty-four gates in length. The use of this type of binary weighting of each delay segment allows a wide range of delays to be selected from a relatively small number of logic gates, but should not be construed to limit the present invention, nor should the choice of any given increment of delay times in the delay elements. For simplicity, the clock input to each of the flip-flops 221, 222 and 224 is omitted from FIG. 4A.

With regard to the delay segment 210, the delay element 201 supplies an output via connection 206 to the multiplexer 211. The flip-flop 221 provides its output (Q) via connection 226 both to the multiplexer 211 and as the next input to the flip-flop 221. If a logic high (logic 1) is supplied to the multiplexer 211, the output of the delay element 201 is selected, thus providing, in this example, an added delay of one gate to the signal traversing the delay segment 210. If a logic low (logic 0) is supplied to the multiplexer 211, the output via connection 216 is selected, thus bypassing the delay element 201. Similarly, the delay segment 220 includes a delay element 202, which provides an output via connection 207 to the multiplexer 212. The flip-flop 222 provides an output to the multiplexer 212 via connection 227 and also via connection 232 to the input of flip-flop 222. If a logic high (logic 1) is supplied to the multiplexer 212, the output of the delay element 202 is selected, thus providing, in this example, an added delay of two gates to the signal traversing the delay segment 220. If a logic low (logic 0) is supplied to the multiplexer 212, the output via connection 217 is selected, thus bypassing the delay element 202.

The delay segment 230 includes a delay element 204, which provides an output via connection 208 to the multiplexer 214. The flip-flop 224 provides its output via connection 228 to the multiplexer 214 and also as input via connection 234 to the input of the flip-flop 224. If a logic high (logic 1) is supplied to the multiplexer 214, the output of the delay element 204 is selected, thus providing, in this example, an added delay of 64 gates to the signal traversing the delay segment 230. If a logic low (logic 0) is supplied to the multiplexer 214, the output via connection 218 is selected, thus bypassing the delay element 204.

The output of the combinational delay line 200 (i.e., the output of the delay segment 230 via the multiplexer 214) is supplied via connection 159 to the destination flip-flop 156 in FIGS. 3A, 3B and 3C.

The combinational delay line 200 can be configured to provide a minimum delay of seven (multiplexer) gates if the flip-flops 221 and 222 through 224 are loaded with all zeros. The combinational delay line 200 can be dynamically reconfigured to provide a maximum delay of seven (multiplexer) gates plus $2^7-1$ (a total of 7+127=134) gates, and any value between 7 and 134 gate delays. By appropriately choosing the inputs to the flip-flops 221 and 222 through 224, each of the delay elements 201, 202 and 204 are selectable via binary weighting so that incremental delays between 7 and 134 gates are possible. In this manner, a broad delay range is provided by the combinational delay line 200. Note that in the preferred embodiment, flip-flops 221 and 222 through 224 are connected on a scan chain, and this scan chain is used to load their values. The Q-to-D feedback connections 231, 213 and 234 assure that these scanned-in values are held during normal clocking.

Figure 4B:
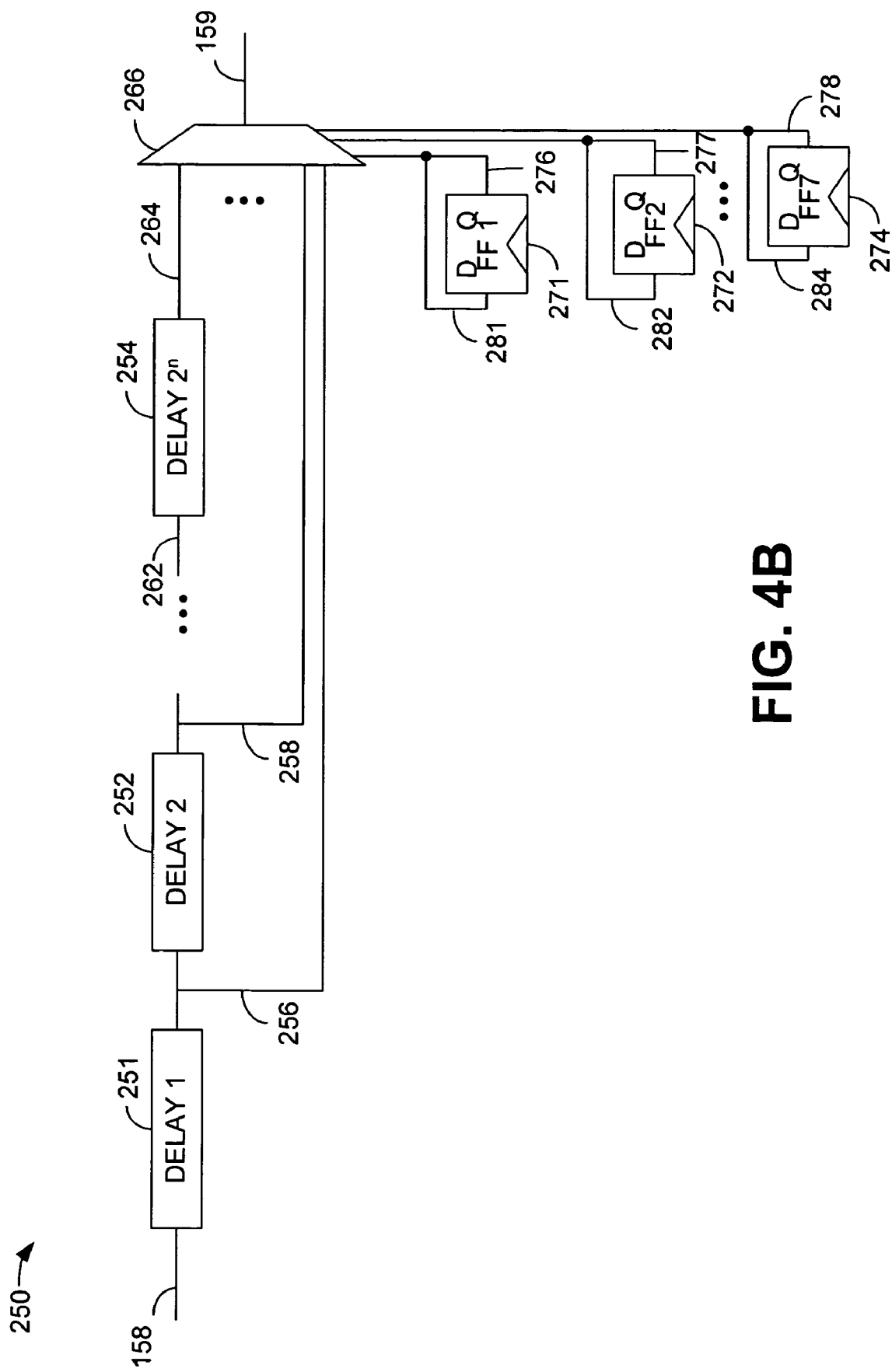
FIG. 4B is a block diagram illustrating another embodiment of the combinational delay line of FIG. 3A.

FIG. 4B is a block diagram illustrating an alternative embodiment 250 of the combinational delay line 200 of FIG. 4A. The combinational delay line 250 includes 264 delay elements, three of which are illustrated using reference numerals 251 and 252 through 254 for simplicity. The delay elements 251 and 252 through 254 each have the same delay value, in contrast to the binary weighted delay elements of FIG. 4A. These uniform delay elements 251 and 252 through 254 are connected in series. Each delay element includes a connection to a multiplexer 266. For example, the delay element 251 connects to the multiplexer 266 via connection 256, the delay element 252 connects to the multiplexer 266 via connection 258, and so on up to connection 264. The multiplexer 266 selects one of the accumulated delays on connections 256 through 264 based on decoding the values stored in the flip-flops 271 and 272 through 274. Although shown using three flip-flops, when implemented using a decoder, the number of flip-flops is typically fewer than the number of delay elements. The combinational delay circuit 250 has a more linear delay characteristic than the delay line 200, but at the expense of considerably more logic gates.

The following description of the operation of the calibration circuit 150 will refer to FIGS. 3A, 3B and 3C; and FIGS. 4A and 4B. With regard to FIG. 3B, when the integrated IC 100 is placed in a functional test mode with a free running clock signal (i.e., the system clock runs at the operating frequency of the integrated circuit), the calibration circuit 150 becomes a three stage shift register. For example, whatever input is placed onto pad 102 will appear on pad 119 after three clock cycles. For example, during functional test mode, upon a first clock pulse, data is transferred from the pad 102 to the pre-launch flip-flop 152. On a second clock pulse, the data transitions from the pre-launch flip-flop 152 via connection 157 to the launch flip-flop 154. On the third clock pulse, the data transitions from the launch flip-flop 154 via connection 158 through the combinational delay line 200 to the destination flip-flop 156 via connection 159. If the combinational delay line is set to cause a delay longer than the cycle time of the clock pulse, then the data in the launch flip-flop 154 will not likely transition to the destination flip-flop 156 within the time period allotted by the third clock pulse. If the combinational delay line 200 is less than one clock cycle long, then the transition on pad 102 will appear on pad 119 in three clock cycles. If the combination delay line is longer than one clock cycle long, then the transition on pad 102 will not appear at pad 119 after three clock cycles, and the destination flip-flop 156 will still maintain its prior value.

With regard to FIG. 3C, after the flip-flops 152 and 154 controlling the combinational delay line 200 have been loaded via scan with a delay setting and the integrated circuit containing the autonomous calibration circuit 170 is placed in functional mode with a free-running clock, raising the AC_CAL_START signal 172 will cause the calibration circuit 170 to continuously compare the amount of programmed delay to the clock period of the clock signal 162. If the delay is more than one clock period (but less than two clock periods), then the AC_CAL_FAIL signal 186 will register the delay as a failure. As will be described below, the delay provided by the combinational delay line 200 when the IC 100 is in functional test mode is indicative of the speed at which the IC 100 can operate while still allowing accurate data transitions through the combinational delay line 200. This delay value can then be used to determine the speed of the IC 100 during scan test mode. The difference in operating speed of the IC during functional test mode and scan test mode is indicative of the amount of clock period elongation caused by supply voltage drop, and can be used to determine an appropriate clock speed at which to test the IC 100 to ensure that the testing is performed at the rated operating speed of the IC 100.

When an embodiment of the calibration circuit 150 is used in scan test mode, the input clock is stopped, a delay setting is scanned into the combination delay line 200, and beginning values are scanned into the pre-launch flip-flop 152 and the launch flip-flop 154. For example, assume that a logic 0 is initially scanned into the pre-launch flip-flop 152 and a logic 1 is scanned into the launch flip-flop 154. Now, in accordance with operating in AC, or dynamic, scan test mode, exactly two clock pulses at the normal operating frequency of the integrated circuit 100 are provided. Upon the rising edge (although some systems may implement data transitions on the falling edge of a clock pulse) of the first clock pulse, the launch flip-flop 154 transitions state from a logic 0 to a logic 1, thus launching a 0-to-1 transition through the combinational delay line 200. On the second clock pulse, if the transition was successful, then a logic 1 will be captured in the destination flip-flop 156. If the delay provided by the combinational delay line 200 is too long (i.e., longer than the duration of the second clock pulse) then the logic 1 has not transitioned to the destination flip-flop 156, and the destination flip-flop 156 will capture a logic 0. Therefore, given the beginning state assumptions above, if a logic 0 is in the destination flip-flop 156 after two clock pulses occurring at the operating frequency of the IC 100, then the delay line is set too long. This will be described in further detail below. The just-described example is for a "system clock launched" test in which a first clock pulse launches a transition and a second clock pulse captures the transition and is intended to be illustrative and not limiting. Alternatively, for example, a "last shift launched" test can also be used. A last shift launched scan test uses a last shift of the scan chain to launch a transition, and then applies a single clock pulse, which is carefully timed to be one clock period, T, after the last shift clock pulse, to capture the data.

Figure 5A:
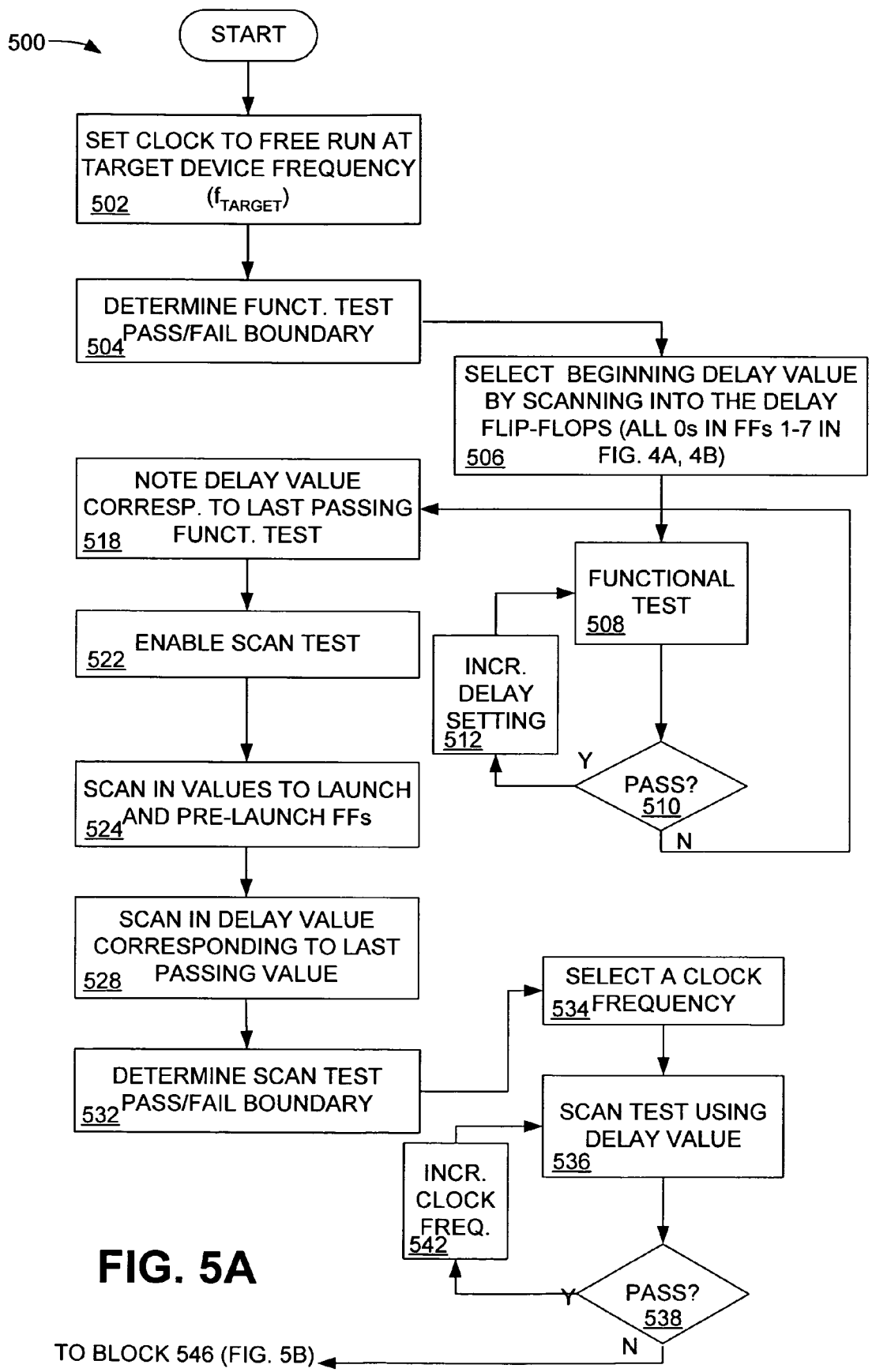
FIGS. 5A and 5B are flowcharts collectively illustrating one embodiment of the operation of the calibration circuit of FIGS. 3A, 3B and 3C.
Figure 5B:
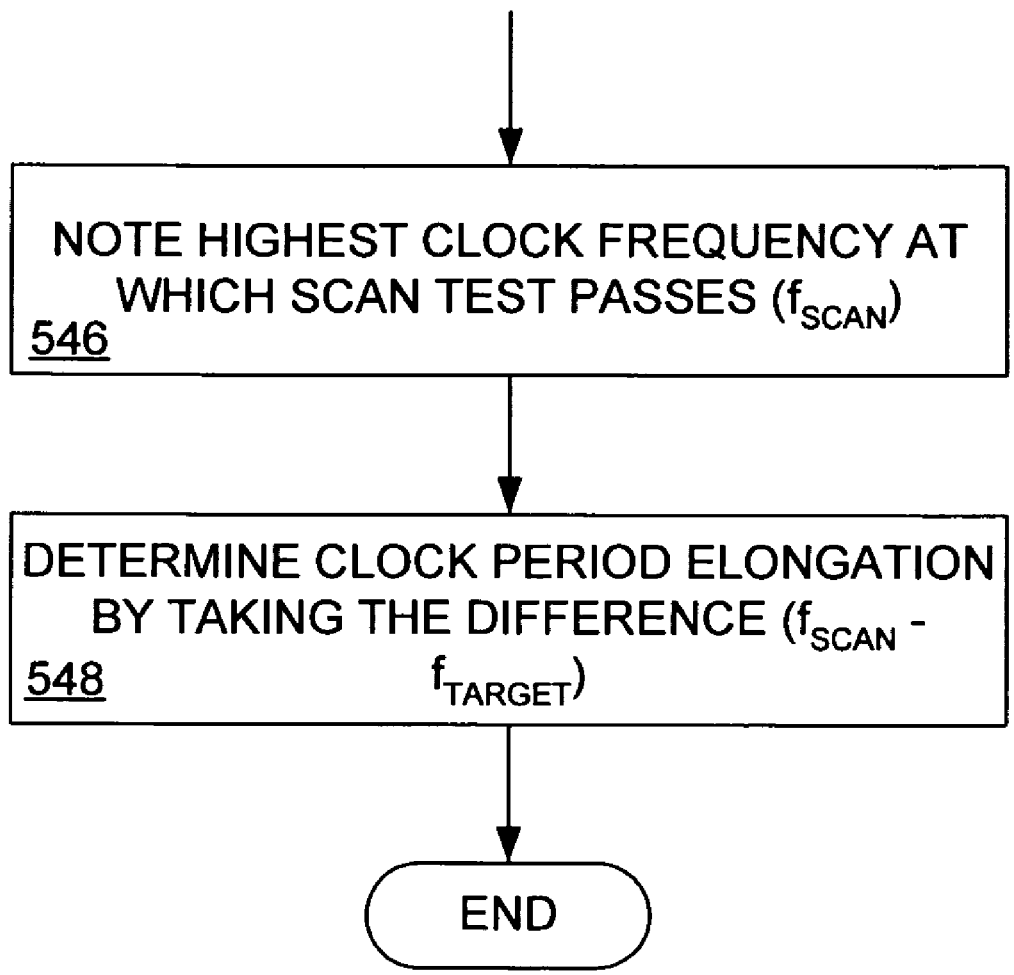

FIGS. 5A and 5B are flowcharts 500 collectively illustrating one embodiment of the operation of the calibration circuit 150 of FIGS. 3A, 3B and 3C. The blocks in the flowcharts to follow are representative of the operation of the invention and need not be performed in the order shown. The blocks may be performed concurrently, or out of the order shown. In block 502 the system clock associated with the IC 100 is set to run at the target operating frequency of the IC 100. The target operating frequency of the IC 100 is referred to as $f_{TARGET}$. For example, if the IC 100 is rated to have a 312.5 MHz operating frequency, then the system clock referred to in block 502 is set to free run at a frequency of 312.5 MHz. Next, in block 504, the functional test pass/fail boundary is determined. The functional test pass/fail boundary refers to the delay value of the combinational delay line 200 (FIG. 4) that will cause the IC 100 to fail a functional test at the free running clock frequency $f_{TARGET}$ chosen in block 502.

In block 506, a beginning delay value is selected for the combinational delay line 200 at which the functional test is expected to pass and scanned into the flip-flops 221, 222, and 224 of FIG. 4A. For example, if all zeros are scanned into the flip-flops 221, 222 and 224, then the delay through the combinational delay line 200 would be equal to the minimum possible delay of seven gate delays, at which the functional test should easily pass. Larger initial delay settings could be used to reduce the time spent in this calibration loop.

In block 508 a functional test is performed by providing a steady stream of clock pulses at the target device frequency chosen in block 502, then causing a transition at the data input to the calibration circuit and checking for the resulting transition at the data output exactly three clock cycles later. In block 510, it is determined whether the IC 100 passes the functional test. If the IC passes the functional test, then the initial delay setting loaded into the combinational delay line 200 is increased in block 512. The IC 100 is again functional tested in block 508. The functional test is repeated until the delay value associated with the last passing functional test is determined. In this manner, the function test pass/fail boundary is determined. If the functional test in block 510 fails, the process proceeds to block 518.

In block 518, the delay value corresponding to the last passing functional test (i.e., the longest delay setting at which the IC 100 passes the functional test at the frequency $f_{TARGET}$) is noted.

In block 522 scan test is enabled by providing a logic 1 by the parallel scan input 168 (FIG. 3B). In block 524, initial values are scanned into the pre-launch flip-flop 152 and the launch flip-flop 154. As described above, a logic 0 could be loaded into the pre-launch flip-flop 152 and a logic 1 could be loaded into the launch flip-flop 154.

In block 528, the delay value corresponding to the last passing functional test noted in block 518 is loaded into the combinational delay line 200. In block 532, the scan test pass/fail boundary is determined. The scan test pass/fail boundary refers to the delay value of the combinational delay line 200 (FIGS. 4A and 4B) that will cause the IC 100 to fail a scan test at a clock frequency that is generally higher than $f_{TARGET}$. In block 534, a beginning scan test clock frequency is chosen. For example, if an initial clock frequency that is equal to the target device frequency (equal to $f_{TARGET}$ in block 502), is chosen, then it is highly likely that the scan test will pass.

In block 536, a scan test is performed on the IC 100 using the delay value entered in block 528. In block 538, it is determined whether the IC 100 passes the scan test. If the IC passes the scan test, then, in block 542, the clock frequency chosen in block 534 is increased. The scan test is repeated until the highest clock frequency at which the scan test passes is noted. This frequency is referred to as $f_{SCAN}$. Note that $f_{SCAN}$ is higher than $f_{TARGET}$, so the IC will be operating at a clock frequency above its target. If the IC fails the scan test in block 538, the process proceeds to block 546.

In block 546, the clock frequency at which the scan test passes ($f_{SCAN}$) is noted. In block 548, the clock period elongation caused by supply voltage drop is determined by taking the difference between $f_{SCAN}$ and $f_{TARGET}$. In this manner, an appropriate clock frequency at which to perform scan testing can be accurately determined by the calibration circuit 150 located on the same chip as the integrated circuit 100. To measure the clock output delay with respect to the input pulse due to voltage drop and to adjust the input clock frequency accordingly, the calibration circuit 150 is implemented with a combinational line 200, the inputs to which are chosen appropriately to allow the functional test clock speed (target device frequency $f_{TARGET}$) to be determined, and to also to allow the scan test clock frequency ($f_{SCAN}$) to be accurately determined. The difference between $f_{SCAN}$ and $f_{TARGET}$ indicates the amount of clock delay due to supply voltage drop. The accurate determination of these two clock frequencies, allows a scan test frequency to be chosen that will test the IC 100 at its designed clock speed.

Figure 6A:
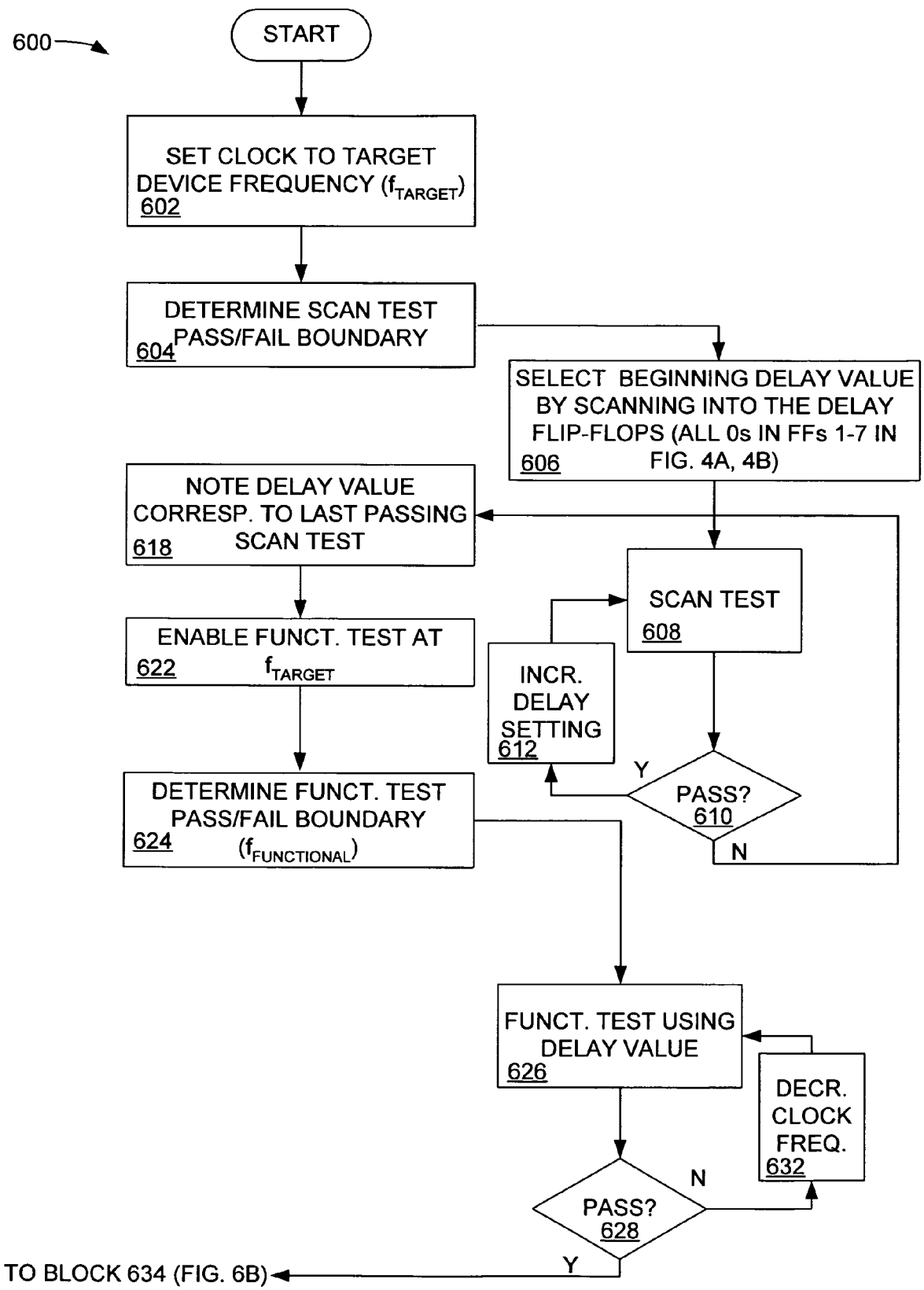
FIGS. 6A and 6B are flowcharts collectively illustrating another embodiment of the operation of the calibration circuit of FIGS. 3A, 3B and 3C.
Figure 6B:
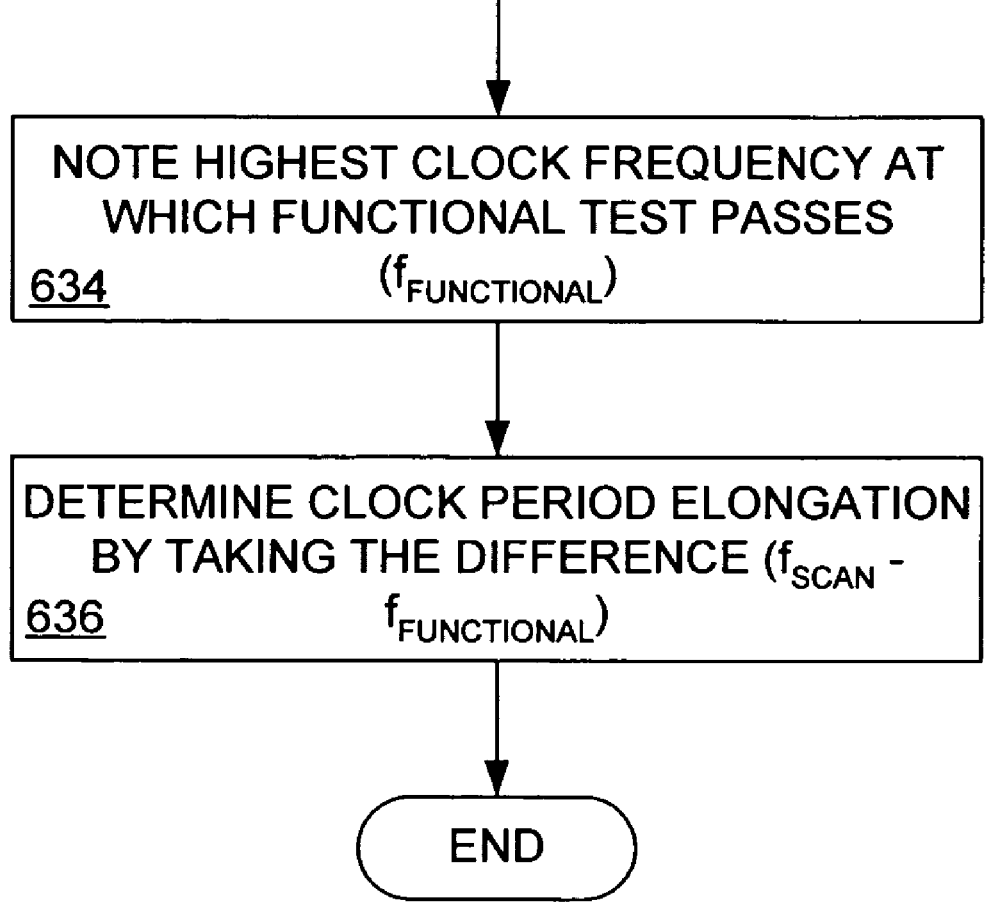

FIGS. 6A and 6B are flowcharts 0.600 collectively illustrating an alternative embodiment of the operation of the calibration circuit 150 of FIGS. 3A, 3B and 3C. In block 602 the system clock associated with the IC 100 is set to run at the target operating frequency of the IC 100. In this embodiment, the target operating frequency of the IC 100 is referred to as $f_{TARGET}$. For example, if the IC 100 is rated to have a 312.5 MHz operating frequency, then the system clock referred to in block 602 is set to free run at a frequency of 312.5 MHz. For the purposes of this embodiment, this frequency is also referred to as $f_{SCAN}$, as it represents the maximum frequency at which the scan test last passes.

Next, in block 604, the scan test pass/fail boundary is determined. The scan test pass/fail boundary refers to the delay value of the combinational delay line 200 (FIGS. 4A and 4B) that will cause the IC 100 to fail a scan test at the clock frequency $f_{TARGET}$ chosen in block 602.

In block 604, a beginning delay value is selected for the combinational delay line 200 at which the scan test is expected to pass and is scanned into the flip-flops 221, 222 and 224 of FIG. 4A. For example, if all zeros are scanned into the flip-flops 221, 222 and 224, then the delay through the combinational delay line 200 would be equal to the minimum possible delay of seven gate delays, at which the scan test should easily pass. A larger initial delay setting could be used to reduce the time spent in this calibration loop.

In block 608 a scan test is enabled by providing a logic 1 by the parallel scan input signal 168 (FIG. 3B). In block 608, initial values are scanned into the pre-launch flip-flop 152 and the launch flip-flop 154. As described above, a logic 0 could be loaded into the pre-launch flip-flop 152 and a logic 1 could be loaded into the launch flip-flop 154. In block 610, it is determined whether the IC 100 passes the scan test. If the IC 100 passes the scan test, then the initial delay setting loaded into the combinational delay line 200 is increased in block 612. The IC 100 is again scan tested in block 608. The scan test is repeated until the delay value associated with the last passing scan test is determined. In this manner, the scan test pass/fail boundary is determined. If the functional test in block 610 fails, the process proceeds to block 618.

In block 618, the delay value corresponding to the last passing scan test (i.e., the longest delay setting at which the IC 100 passes the scan test at the frequency $f_{SCAN}$) is noted and loaded into the combinational delay line 200. In block 622, the IC 100 is placed in functional test mode with a steady stream of input clock pulses starting at the frequency $f_{SCAN}$ which is the same as the IC's original target frequency $f_{TARGET}$. In block 624, the functional test pass/fail boundary is determined. The functional test pass/fail boundary refers to the frequency that will cause the IC 100 to fail a functional test at the delay setting noted in block 618. This frequency is called $f_{FUNCTIONAL}$.

In block 626 a functional test is performed by providing a steady stream of clock pulses at the target device frequency, $f_{TARGET}$, chosen in block 602, thus causing a transition at the data input to the calibration circuit and checking for the resulting transition at the data output exactly three clock cycles later. In block 628, it is determined whether the IC 100 passes the functional test. If the IC fails the functional test, as expected, then the frequency is decreased in block 632. The IC 100 is again functional tested in block 626. The functional test is repeated until the frequency associated with the delay value from the last passing scan test is determined. In this manner, the function test pass/fail boundary is determined. Note that this new frequency, $f_{FUNCTIONAL}$, the clock frequency at which the functional test passes with the delay setting derived from the scan test, is lower than the original IC target frequency, $f_{TARGET}$.

In block 634, the clock frequency at which the functional test passes ($f_{FUNCTIONAL}$) is noted. In block 636, the clock period elongation caused by supply voltage drop is determined by determining the difference between $f_{SCAN}$ and $f_{FUNCTIONAL}$. In this manner, an appropriate clock frequency at which to perform scan testing can be accurately determined by the calibration circuit 150 located on the same chip as the integrated circuit 100. To measure the clock output delay with respect to the input pulse due to voltage drop and to adjust the input clock frequency accordingly, the calibration circuit 150 is implemented with a combinational line 200, the inputs to which are chosen appropriately to allow the functional test clock speed (target device frequency, $f_{TARGET}$) to be determined, and also to allow the scan test clock frequency ($f_{SCAN}$) to be accurately determined. The difference between $f_{SCAN}$ and $f_{FUNCTIONAL}$ indicates the amount of clock delay due to supply voltage drop. The accurate determination of these two clock frequencies, allows a scan test frequency to be chosen that will test the IC 100 at its designed clock speed.

The embodiments described in FIGS. 5A, 5B, 6A and 6B alter the frequency of the input clock to the calibration circuit to quantify the performance difference between functional and scan testing. When the source of the input clock is an external signal, such as from automated test equipment (ATE), adjustment of the input clock frequency is relatively simple. However, when the frequency of the input clock is not adjustable, as in the case of a fixed crystal oscillator or a phase-locked loop (PLL), then the embodiment of FIGS. 7A and 7B may be more appropriate.

Figure 7A:
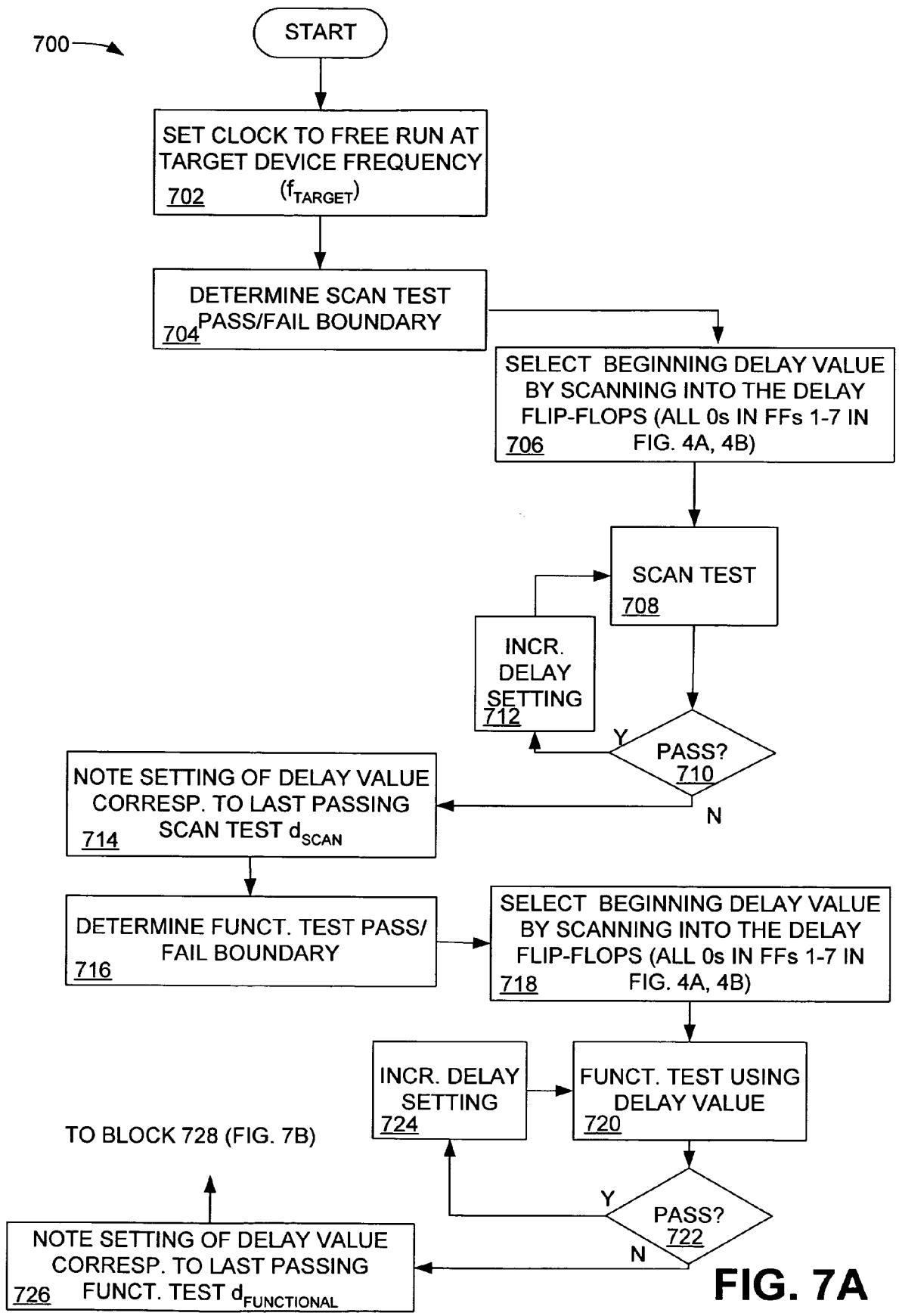
FIGS. 7A and 7B are flowcharts collectively illustrating another embodiment of the operation of the calibration circuit of FIGS. 3A, 3B and 3C.
Figure 7B:
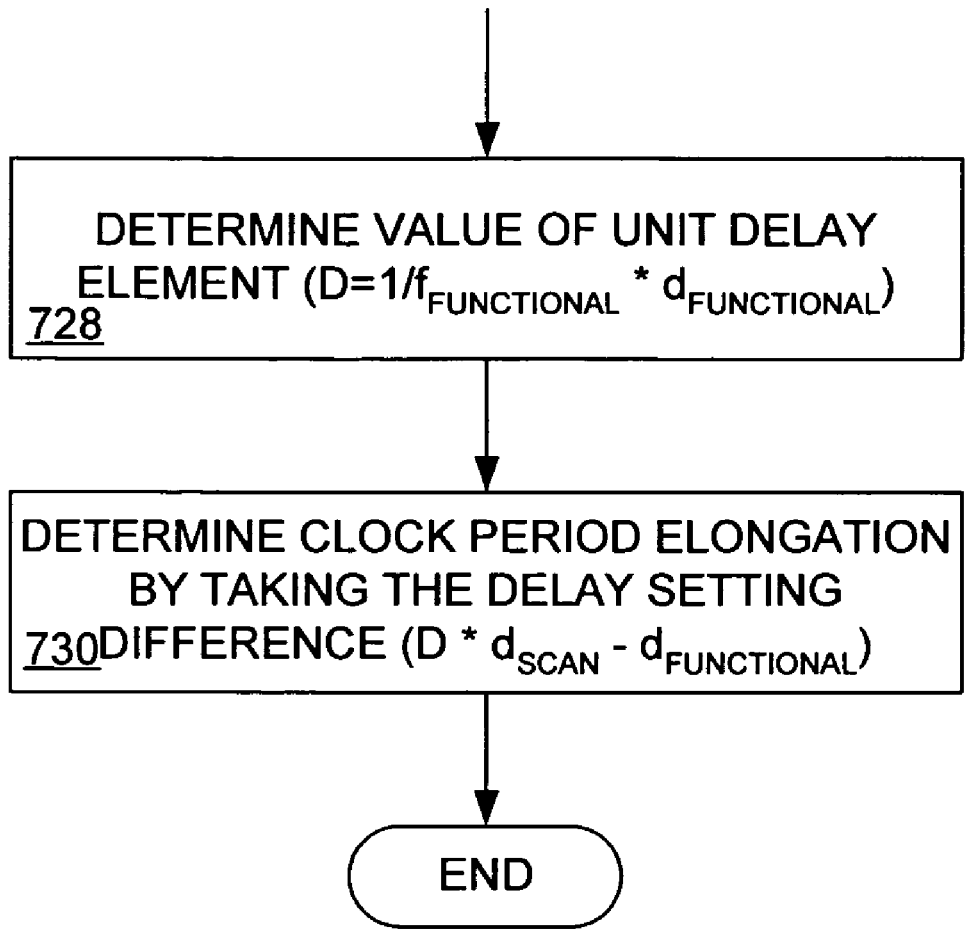

FIGS. 7A and 7B are flowcharts 700 collectively illustrating another alternative embodiment of the operation of the calibration circuit 150 of FIGS. 3A, 3B and 3C. The embodiment 700 is applicable in cases where the frequency of the input clock is not adjustable, as in the case of a fixed crystal oscillator or a phase-locked loop (PLL). In block 702 the system clock associated with the IC 100 is set to run at the target operating frequency of the IC 100. The target operating frequency of the IC 100 is referred to as $f_{TARGET}$. For example, if the IC 100 is rated to have a 312.5 MHz operating frequency, then the system clock referred to in block 702 is set to free run at a frequency of 312.5 MHz.

Next, in block 704, the scan test pass/fail boundary is determined. The scan test pass/fail boundary refers to the delay value of the combinational delay line 200 (FIGS. 4A and 4B) that will cause the IC 100 to fail a scan test at the clock frequency $f_{TARGET}$ chosen in block 702.

In block 706, a beginning delay value is selected for the combinational delay line 200 at which the scan test is expected to pass and scanned into the flip-flops of FIG. 4A or 4B. For example, if all zeros are scanned into the flip-flops 221, 222 and 224, then the delay through the combinational delay line 200 would be equal to the minimum possible delay of seven gate delays, at which the scan test should easily pass. A larger initial delay setting could be used to reduce the time spent in this calibration loop.

In block 708 a scan test is enabled by the parallel scan input signal 168 (FIG. 3B) providing a logic 1. In block 708, initial values are scanned into the pre-launch flip-flop 152 and the launch flip-flop 154. As described above, a logic 0 could be loaded into the pre-launch flip-flop 152 and a logic 1 could be loaded into the launch flip-flop 154. In block 710, it is determined whether the IC 100 passes the scan test. If the IC passes the scan test, then the initial delay setting loaded into the combinational delay line 200 is increased in block 712. The IC 100 is again scan tested in block 708. The scan test is repeated until the delay value associated with the last passing scan test is determined. In this manner, the scan test pass/fail boundary is determined. If the scan test in block 710 fails, the process proceeds to block 714.

In block 714, the delay value corresponding to the last passing scan test (i.e., the longest delay setting at which the IC 100 passes the scan test at the frequency $f_{TARGET}$) is noted as $d_{SCAN}$.

In block 716, the functional test pass/fail boundary is determined. The functional test pass/fail boundary refers to the delay value of the combinational delay line 200 (FIG. 4A or 4B) that will cause the IC 100 to fail a functional test at the clock frequency $f_{TARGET}$ chosen in block 702.

In block 718, a beginning delay value is selected for the combinational delay line 200 at which the functional test is expected to pass and scanned into the flip-flops of FIG. 4A or 4B. For example, if all zeros are scanned into the flip-flops 221, 222 and 224, then the delay through the combinational delay line 200 would be equal to the minimum possible delay of seven gate delays, at which the functional test should easily pass. A larger initial delay setting could be used to reduce the time spent in this calibration loop.

In block 720 a functional test is performed by providing a steady stream of clock pulses at the target device frequency chosen in block 702, thus causing a transition at the data input to the calibration circuit and checking for the resulting transition at the data output exactly three clock cycles later. In block 722, it is determined whether the IC 100 passes the functional test. If the IC passes the functional test, as expected, then the frequency is increased in block 724. The IC 100 is again functional tested in block 720. The functional test is repeated until the delay value from the last passing functional test is determined. In this manner, the function test pass/fail boundary is determined. Note that this new delay value, $d_{FUNCTIONAL}$, is expected to be lower than the scan delay value $d_{SCAN}$. In block 726, the delay value at which the functional test passes, $d_{FUNCTIONAL}$, is noted.

In block 728, the size of a unit delay element is calculated by comparing $f_{TARGET}$ and $d_{FUNCTIONAL}$. These two quantities are related in that the period of the clock running at the frequency of $f_{TARGET}$ is matched by the delay through the delay line when the delay set to $d_{FUNCTIONAL}$. Thus, dividing that period according to $(1/f_{TARGET})*d_{FUNCTIONAL}$ will yield the size of the unit delay element D, which will be used in the next step to determine the difference in the clock periods between the scan and functional tests.

In block 730, the clock period elongation caused by supply voltage drop is determined by taking the difference between $d_{SCAN}$ and $d_{FUNCTIONAL}$ and multiplying the difference by the unit delay D. In this manner, an appropriate offset to the clock frequency at which to perform scan testing can be accurately determined by the calibration circuit 150 located on the same chip as the integrated circuit 100. To measure the clock output delay with respect to the input pulse due to voltage drop and to adjust the input clock frequency accordingly, the calibration circuit 150 is implemented with a combinational line 200, the inputs to which are chosen appropriately to allow the scan test clock frequency ($f_{SCAN}$) to be accurately determined relative to the target device frequency $f_{TARGET}$. The difference between $f_{SCAN}$ and $f_{TARGET}$ indicates the amount of clock delay due to supply voltage drop. The accurate determination of these two clock frequencies, allows a scan test frequency to be chosen that will test the IC 100 at its designed clock speed.

Figure 8:
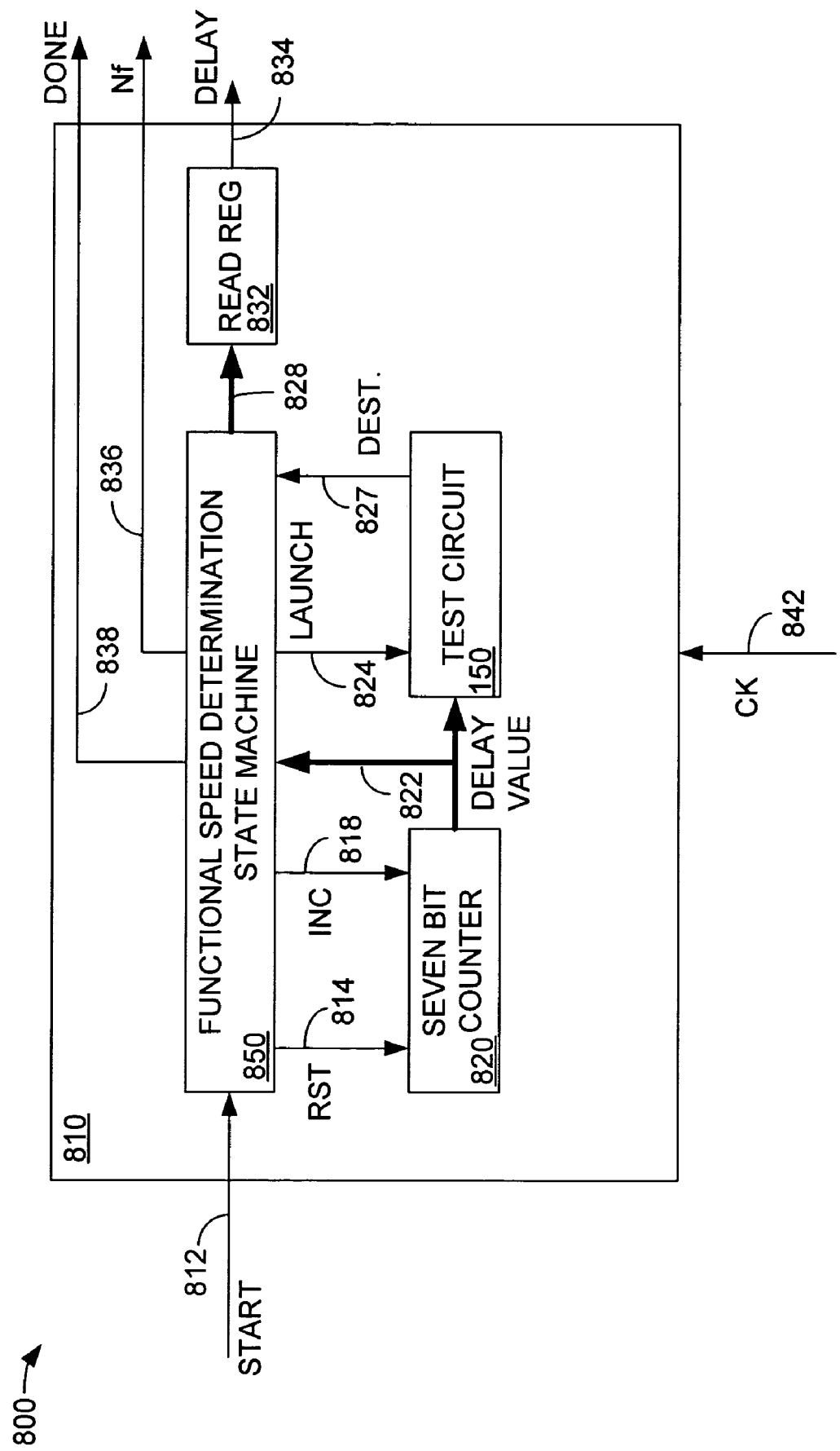
FIG. 8 is a block diagram illustrating a circuit to automate portions of the flowchart of FIGS. 5A and 5B.

FIG. 8 is a block diagram 800 illustrating a circuit that can be implemented to automate portions of the flowchart 500 of FIGS. 5A and 5B. The block diagram 800 includes automatic calibration circuitry 810, which includes a functional speed determination state machine 850 (referred to hereafter as "speed state machine"), a seven-bit counter 820, the calibration circuit 150 of, for example, FIG. 3B, and a read register 832. The input start signal is provided to the speed state machine 850 via connection 812. The speed state machine 850 provides a reset signal on connection 814 and an increment signal via connection 818 to the seven-bit counter 820. The output of the seven bit counter is provided via connection 822 to the speed state machine 850 and to the calibration circuit 150. The output of the seven-bit counter is the delay value that is loaded into the combinational delay line 200 in block 506 of FIG. 5A. The speed state machine 850 also provides a launch input to the launch flip-flop 154 via connection 824 and receives the output of the destination flip-flop 156 via connection 827. The speed state machine 850 iterates the steps 502 through 518 of the flowchart 500 and obtains the delay value corresponding to the last passing functional test. The delay value is provided via connection 828 to the read register 832, where the delay value is available for being read. The output of the read register 832 via connection 834 is the delay value of the combinational delay line 200 corresponding to the pass/fail boundary of the functional test determined in block 510 of FIG. 5A.

Figure 9:
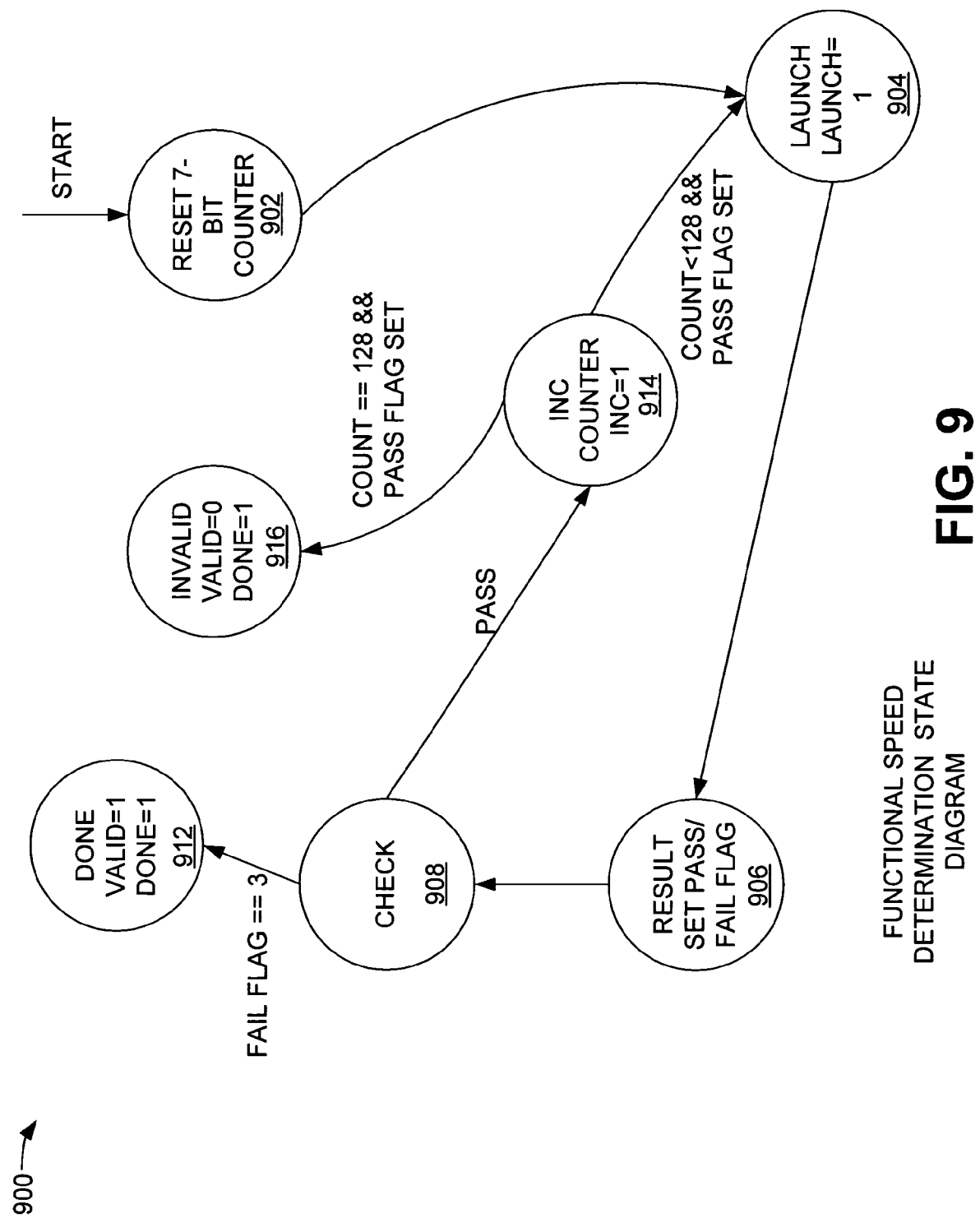
FIG. 9 is a state diagram corresponding to the state machine of FIG. 8.

FIG. 9 is a state diagram 900 corresponding to the speed state machine 850 of FIG. 8. In state 902, a start signal is received via connection 812 and the seven-bit counter 820 (FIG. 8) is reset to zero. In state 904, the launch flip-flop 154 (FIG. 3B) is set to a logic 1. In step 906 a functional test is performed and a pass/fail flag is set. In state 908, it is determined whether the IC passes the functional test. If the IC passes the functional test, then in state 914 the seven-bit counter 820 is incremented by one, thus increasing by a value of one the delay provided by the combinational delay line 200 (FIG. 3B). If the count is equal to 128, and the pass flag is set, then the process proceeds to state 916. If the seven-bit counter 820 is at a value less than 128 and the pass flag is set, then the state diagram proceeds to state 904.

If the check state 908 indicates that the functional test is failed, then the state diagram proceeds to state 912 and the process is completed. The state diagram 900 iterates the operation of the speed state machine until the delay value corresponding to the last passing functioning test (i.e., the longest delay setting at which the IC 100 passes the functional test at the frequency $f_{NOMINAL}$) is noted.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A circuit for determining operating speed of a clock associated with an integrated circuit (IC), comprising:
   an IC logic element located on the integrated circuit;
   a scan chain located on the integrated circuit; and
   a calibration circuit located on the integrated circuit and coupled to the IC logic element and to the scan chain, the calibration circuit comprising a first plurality of flip-flops and a combinational delay line, in which the calibration circuit operates in a functional test mode and in a scan test mode to determine a clock signal delay between the functional test mode and the scan test mode by measuring a difference in clock speed caused by power supply voltage drop between functional test mode and scan test mode and wherein the calibration circuit continuously compares a delay of the combinational delay line with a clock period of the clock signal, in which a digital delay provided by the combinational delay line is dynamically reconfigurable and in which the digital delay is used to choose a scan test frequency that tests the IC at a designed clock speed.

2. The circuit of claim 1, further comprising:
   a second plurality of flip-flops associated with the combinational delay line, the second plurality of flip-flops configured to provide a selectable delay through the combinational delay line.

3. The circuit of claim 2, in which the selectable delay is binary weighted.

4. The circuit of claim 2, further comprising a state machine configured to automatically determine the selectable delay.

5. A method for comparing integrated circuit (IC) performance in functional test mode and in scan test mode, comprising:
   operating a clock located on the IC at a frequency ($f_{TARGET}$) at which IC operation is sought to be determined;
   loading a beginning delay value into a calibration circuit located on the IC;
   functional testing the IC to determine a test delay value corresponding to a functional test pass/fail boundary;
   enabling scan test of the IC;
   loading the test delay value into the calibration circuit;
   selecting a second clock frequency;
   applying two clock cycles at the selected second clock frequency;
   scan testing the IC using the test delay value to determine the highest clock frequency ($f_{SCAN}$) at which the IC passes the scan test; and
   determining a delay within the selected clock frequency by comparing the difference between $f_{SCAN}$ and $f_{TARGET}$ by measuring a difference in clock speed caused by power supply voltage drop between functional test mode and scan test mode and continuously comparing the test delay value with a clock period of the clock, in which the test delay is a digital delay value and is dynamically reconfigurable and in which the test delay value is used to choose a scan test frequency that tests the IC at a designed clock speed.

6. The method of claim 5, in which the delay value is selectable using binary weighting.

7. The method of claim 6, further comprising using a state machine to automatically determine the selectable delay value.

8. The method of claim 5, in which a first clock pulse is implemented using a last shift of a scan chain associated with the IC to launch a transition, and a second clock pulse is implemented to capture data.

9. A method for comparing integrated circuit (IC) performance in a functional test mode and in a scan test mode, comprising:
   operating a clock located on the IC at a target frequency at which IC operation is sought to be determined ($f_{SCAN}$);
   loading a beginning delay value into a calibration circuit located on the IC;
   scan testing the IC to determine a calibration delay value corresponding to a scan test pass/fail boundary by applying two clock cycles at the selected clock frequency;
   enabling functional test of the IC;
   loading the calibration delay value into the calibration circuit;
   functional testing the IC using the calibration delay value to determine the highest clock frequency ($f_{FUNCTIONAL}$) at which the IC passes the functional test; and
   determining a clock period elongation by comparing the difference between $f_{SCAN}$ and $f_{FUNCTIONAL}$ by measuring a difference in clock speed caused by power supply voltage drop between functional test mode and scan test mode and continuously comparing the test delay value with a clock period of the clock, in which a digital delay provided by the combinational delay line is dynamically reconfigurable and in which the digital delay is used to choose a scan test frequency that tests the IC at a designed clock speed.

10. The method of claim 9, in which the delay value is selectable using binary weighting.

11. The method of claim 10, further comprising using a state machine to automatically determine the selectable delay value.

12. A method for comparing integrated circuit (IC) performance in functional test mode and in scan test mode, comprising:

functional testing an IC to determine a delay value associated with a nominal clock frequency ($f_{TARGET}$);

scan testing the IC using the delay value to determine a scan test clock frequency ($f_{SCAN}$); and determining a clock delay by taking the difference between $f_{SCAN}$ and $f_{TARGET}$ using a calibration circuit located on the IC by measuring a difference in clock speed caused by power supply voltage drop between functional test mode and scan test mode and continuously comparing a test delay with a clock period of the clock, in which the delay value is a digital delay and is dynamically reconfigurable and in which the delay value is used to choose a scan test frequency that tests the IC at a designed clock speed.

13. The method of claim 12, in which the delay value is binary selectable between a value of seven gate delays and 128 gate delays.

14. The method of claim 12, further comprising using a state machine to automatically determine the selectable delay value.

15. A method for comparing integrated circuit (IC) performance in functional test mode and in scan test mode, comprising:

operating a clock located on the IC at a target frequency at which IC operation is sought to be determined ($f_{TARGET}$);

loading a beginning delay value into a calibration circuit located on the IC;

scan testing the IC to determine a calibration delay value $d_{SCAN}$ corresponding to a scan test pass/fail boundary by applying two clock cycles at the selected clock frequency;

enabling functional test of the IC;

loading a beginning delay value into a calibration circuit associated with the IC;

functional testing the IC to determine a calibration delay value $d_{FUNCTIONAL}$ corresponding to a functional test pass/fail boundary by applying a steady stream of clock cycles at the selected clock frequency;

determining the unit delay value D by dividing 1 by a product of $f_{FUNCTIONAL}$ and $d_{FUNCTIONAL}$; and determining a clock period elongation by multiplying D times the difference between $d_{SCAN}$ and $d_{FUNCTIONAL}$ by measuring a difference in clock speed caused by power supply voltage drop between functional test mode and scan test mode and continuously comparing the test delay value with a clock period of the clock, in which the test delay value is a digital delay and is dynamically reconfigurable and in which the test delay value is used to choose a scan test frequency that tests the IC at a designed clock speed.

16. The method of claim 15, further comprising using a state machine to automatically determine the selectable delay value.

* * * * *